(12) United States Patent
Sakakura et al.

(10) Patent No.: US 8,890,166 B2
(45) Date of Patent: Nov. 18, 2014

(54) LIGHT-EMITTING DEVICE AND METHOD FOR MANUFACTURING THE SAME

(75) Inventors: Masayuki Sakakura, Tochigi (JP); Yoshiaki Oikawa, Sagamihara (JP); Shunpei Yamazaki, Setagaya (JP); Junichiro Sakata, Atsugi (JP); Masashi Tsubuku, Atsugi (JP); Kengo Akimoto, Atsugi (JP); Miyuki Hosoba, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 586 days.

(21) Appl. No.: 12/871,184

(22) Filed: Aug. 30, 2010

(65) Prior Publication Data
US 2011/0057187 A1    Mar. 10, 2011

(30) Foreign Application Priority Data

Sep. 4, 2009 (JP) ................................ 2009-205075

(51) Int. Cl.
| | |
|---|---|
| H01L 27/14 | (2006.01) |
| H01L 29/04 | (2006.01) |
| H01L 29/15 | (2006.01) |
| H01L 31/036 | (2006.01) |
| H01L 27/32 | (2006.01) |
| H01L 27/12 | (2006.01) |

(52) U.S. Cl.
CPC ........ H01L 27/1251 (2013.01); H01L 27/3262 (2013.01); H01L 27/322 (2013.01); H01L 27/1225 (2013.01)
USPC .............. 257/72; 257/E29.117; 257/E27.131; 257/E27.132

(58) Field of Classification Search
USPC .......... 257/40, 43, 66, 72, E27.131, E27.132, 257/E29.117, E29.137
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |

(Continued)

FOREIGN PATENT DOCUMENTS

| | | |
|---|---|---|
| EP | 1737044 A | 12/2006 |
| EP | 1770788 A | 4/2007 |

(Continued)

OTHER PUBLICATIONS

Fortunato.E et al., "Wide-Bandgap High-Mobility ZnO Thin-Film Transistors Produced at room Temperature,", Appl. Phys. Lett. (Applied Physics Letters), Sep. 27, 2004, vol. 85, No. 13, pp. 2541-2543.

(Continued)

*Primary Examiner* — Benjamin Sandvik
*Assistant Examiner* — Leslie Pilar Cruz
(74) *Attorney, Agent, or Firm* — Eric J. Robinson; Robinson Intellectual Property Law Office, P.C.

(57) ABSTRACT

An object of the present invention is to provide a light-emitting device in which plural kinds of circuits are formed over the same substrate, and plural kinds of thin film transistors are provided in accordance with characteristics of the plural kinds of circuits. An inverted-coplanar thin film transistor, an oxide semiconductor layer of which overlaps with a source and drain electrode layers, and a channel-etched thin film transistor are used as a thin film transistor for a pixel and a thin film transistor for a driver circuit, respectively. Between the thin film transistor for a pixel and a light-emitting element, a color filter layer is provided so as to overlap with the light-emitting element which is electrically connected to the thin film transistor for a pixel.

20 Claims, 16 Drawing Sheets

(56) References Cited

U.S. PATENT DOCUMENTS

| | | |
|---|---|---|
| 6,261,881 B1 | 7/2001 | Yamazaki et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,738,109 B2 | 5/2004 | Jeon |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,298,084 B2 | 11/2007 | Baude et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,646,015 B2 | 1/2010 | Fujii et al. |
| 7,674,650 B2 | 3/2010 | Akimoto et al. |
| 7,696,513 B2 | 4/2010 | Hayashi et al. |
| 7,719,185 B2 | 5/2010 | Jin et al. |
| 7,732,819 B2 | 6/2010 | Akimoto et al. |
| 7,745,798 B2 | 6/2010 | Takahashi |
| 7,915,689 B2 | 3/2011 | Cho et al. |
| 7,943,985 B2 | 5/2011 | Kim et al. |
| 7,982,216 B2 | 7/2011 | Imai |
| 8,003,981 B2 | 8/2011 | Iwasaki et al. |
| 8,017,947 B2 | 9/2011 | Kim et al. |
| 8,022,411 B2 | 9/2011 | Yoon et al. |
| 8,110,436 B2 | 2/2012 | Hayashi et al. |
| 8,232,551 B2 | 7/2012 | Kim et al. |
| 8,502,217 B2 | 8/2013 | Sato et al. |
| 2001/0030323 A1 | 10/2001 | Ikeda |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0232421 A1 | 11/2004 | Ono et al. |
| 2005/0017302 A1 | 1/2005 | Hoffman |
| 2005/0023526 A1 | 2/2005 | Yamazaki |
| 2005/0073051 A1 | 4/2005 | Yamamoto et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194320 A1* | 8/2007 | Cho et al. ............. 257/72 |
| 2007/0194379 A1 | 8/2007 | Hosono et al. |
| 2007/0252145 A1 | 11/2007 | Toyota et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0099759 A1 | 5/2008 | Fujii et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0157081 A1 | 7/2008 | Huh |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0246033 A1 | 10/2008 | Huh et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1* | 12/2008 | Ryu et al. ............. 257/43 |
| 2008/0308796 A1 | 12/2008 | Akimoto et al. |
| 2008/0308797 A1 | 12/2008 | Akimoto et al. |
| 2009/0068773 A1 | 3/2009 | Lai et al. |
| 2009/0072734 A1 | 3/2009 | Harada et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0225251 A1 | 9/2009 | Kaitoh et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044696 A1 | 2/2010 | Cheng et al. |
| 2010/0044701 A1 | 2/2010 | Sano et al. |
| 2010/0044711 A1* | 2/2010 | Imai ............................. 257/59 |
| 2010/0059751 A1 | 3/2010 | Takahashi et al. |
| 2010/0059754 A1* | 3/2010 | Lee et al. ................... 257/59 |
| 2010/0065844 A1 | 3/2010 | Tokunaga |
| 2010/0090211 A1 | 4/2010 | Fujii et al. |
| 2010/0092800 A1 | 4/2010 | Itagaki et al. |
| 2010/0109002 A1 | 5/2010 | Itagaki et al. |
| 2010/0163863 A1 | 7/2010 | Yaegashi |
| 2010/0244022 A1 | 9/2010 | Takahashi et al. |
| 2010/0295042 A1 | 11/2010 | Yano et al. |
| 2011/0012112 A1 | 1/2011 | Yamazaki et al. |
| 2011/0012116 A1 | 1/2011 | Yamazaki et al. |
| 2011/0031492 A1 | 2/2011 | Yamazaki et al. |
| 2011/0031493 A1 | 2/2011 | Yamazaki et al. |
| 2011/0031496 A1 | 2/2011 | Yamazaki et al. |
| 2011/0031497 A1 | 2/2011 | Yamazaki et al. |
| 2011/0032444 A1 | 2/2011 | Yamazaki et al. |
| 2011/0256684 A1 | 10/2011 | Iwasaki et al. |

FOREIGN PATENT DOCUMENTS

| | | |
|---|---|---|
| EP | 1868246 A | 12/2007 |
| EP | 2061086 A | 5/2009 |
| EP | 2226847 A | 9/2010 |
| JP | 60-198861 A | 10/1985 |

(56) References Cited

FOREIGN PATENT DOCUMENTS

| | | |
|---|---|---|
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 08-264794 A | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-124678 A | 4/2002 |
| JP | 2002-198311 A | 7/2002 |
| JP | 2002-289859 A | 10/2002 |
| JP | 2003-029293 | 1/2003 |
| JP | 2003-086000 | 3/2003 |
| JP | 2003-086000 A | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2006-313363 | 11/2006 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2007-250983 A | 9/2007 |
| JP | 2007-250984 A | 9/2007 |
| JP | 2008-135731 | 6/2008 |
| JP | 2009-141002 A | 6/2009 |
| JP | 2009-141341 A | 6/2009 |
| JP | 2009-265271 | 11/2009 |
| JP | 2010-098280 | 4/2010 |
| WO | WO 2004/114391 | 12/2004 |
| WO | WO-2006/109526 | 10/2006 |
| WO | WO-2007/119321 | 10/2007 |
| WO | WO-2007/119386 | 10/2007 |
| WO | WO-2008/105347 | 9/2008 |
| WO | WO-2009/072532 | 6/2009 |
| WO | WO-2009/093722 | 7/2009 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Masuda.S et al., "Transparent thin film transistors using ZnO as an active channel layer and their electrical properties,", J. Appl. Phys. (Journal of Applied Physics), Feb. 1, 2003, vol. 39, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura.M, "Synthesis of Homologous Compound with New Long-Period Structure,", NIRIM Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

(56) References Cited

OTHER PUBLICATIONS

Takahashi et al., "Theoretical Analysis of IGZO Transparent Amorphous Oxide Semiconductor," IDW '08: Proceedings of the 15th International Display Workshops, Dec. 3, 2008, pp. 1637-1640.
Prins et al., "A Ferroelectric Transparent Thin-Film Transistor," Appl. Phys. Lett. (Applied Physics Letters), Jun. 17, 1996, vol. 68, No. 25, pp. 3650-3652.
Nakamura et al., "The Phase Relations in the $In_2O_3$—$Ga_2ZnO_4$—Zno System at 1350° C.," Journal of Solid State Chemistry, Aug. 1, 1991, vol. 93, No. 2, pp. 298-315.
Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.
Nomura et al., "Thin-Film Transistor Fabricated in Single-Crystalline Transparent Oxide Semiconductor," Science, May 23, 2003, vol. 300, No. 5623, pp. 1269-1272.
Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.
Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.
Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.
Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.
Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.
Tsuda et al., "Ultra Low Power Consumption Technologies for Mobile TFT-LCDs," IDW '02: Proceedings of the 9th International Display Workshops, Dec. 4, 2002, pp. 295-298.
Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.
Park et al., "High performance amorphous oxide thin film transistors with self-aligned top-gate structure," IEDM 09: Technical Digest of International Electron Devices Meeting, Dec. 7, 2009, pp. 191-194.
Kurokawa et al., "UHF RFCPUS on Flexible and Glass Substrates for Secure RFID Systems," Journal of Solid-State Circuits, 2008, vol. 43, No. 1, pp. 292-299.
Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.
Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.
Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.
Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.
Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.
Sakata et al., "Development of 4.0-In. AMOLED Display with Driver Circuit Using Amorphous In—Ga—Zn—Oxide TFTs," IDW '09: Proceedings of the 16th International Display Workshops, 2009, pp. 689-692.
Park et al., "Amorphous Indium—Gallium—Zinc Oxide TFTs and their Application for Large Size AMOLED," AM-FPD '08 Digest of Technical Papers, Jul. 2, 2008, pp. 275-277.
Park et al., "Challenge to Future Displays: Transparent AM-OLED Driven by PEALD Grown ZnO TFT," IMID '07 Digest, 2007, pp. 1249-1252.
Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.
Osada et al., "Development of Driver-Integrated Panel using Amorphous In—Ga—Zn—Oxide TFT," AM-FPD '09 Digest of Technical Papers, Jul. 1, 2009, pp. 33-36.
Hirao et al., "Novel Top-Gate Zinc Oxide Thin-Film Transistors (ZnO TFTs) for AMLCDs," Journal of the SID, 2007, vol. 15, No. 1, pp. 17-22.
Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.
Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.
Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.
Miyasaka, "58.2: Invited Paper: Suftla Flexible Microelectronics on their Way to Business," SID Digest '07: SID International Symposium Digest of Technical Papers, 2007, vol. 38, pp. 1673-1676.
Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.
Asaoka et al., "29.1: Polarizer-Free Reflective LCD Combined With Ultra Low-Power Driving Technology," SID Digest '09: SID International Symposium Digest of Technical Papers, 2009, pp. 395-398.
Lee et al., "Current Status of, Challenges to, and Perspective View of AM-OLED," IDW '06: Proceedings of the 13th International Display Workshops, Dec. 7, 2006, pp. 663-666.
Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Kikuchi et al., "Polymer-Stabilized Liquid Crystal Blue Phases," Nature Materials, Sep. 2, 2002, vol. 1, pp. 64-68.
Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C." Journal of Solid State Chemistry, 1985, vol. 60, pp. 382-384.
Kitzerow et al., "Observation of Blue Phases in Chiral Networks," Liquid Crystals, 1993, vol. 14, No. 3, pp. 911-916.
Costello et al., "Electron Microscopy of a Cholesteric Liquid Crystal and Its Blue Phase," Phys. Rev. A (Physical Review. A), May 1, 1984, vol. 29, No. 5, pp. 2957-2959.
Meiboom et al., "Theory of the Blue Phase of Cholesteric Liquid Crystals," Phys. Rev. Lett. (Physical Review Letters), May 4, 1981, vol. 46, No. 18, pp. 1216-1219.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
International Search Report (Application No. PCT/JP2010/064431) Dated Sep. 21, 2010.
Written Opinion (Application No. PCT/JP2010/064431) Dated Sep. 21, 2010.
Tetsuo Nozawa, "Transparent Circuit,", Nikkei Electronics, Aug. 27, 2007, No. 959, pp. 39-52.

* cited by examiner

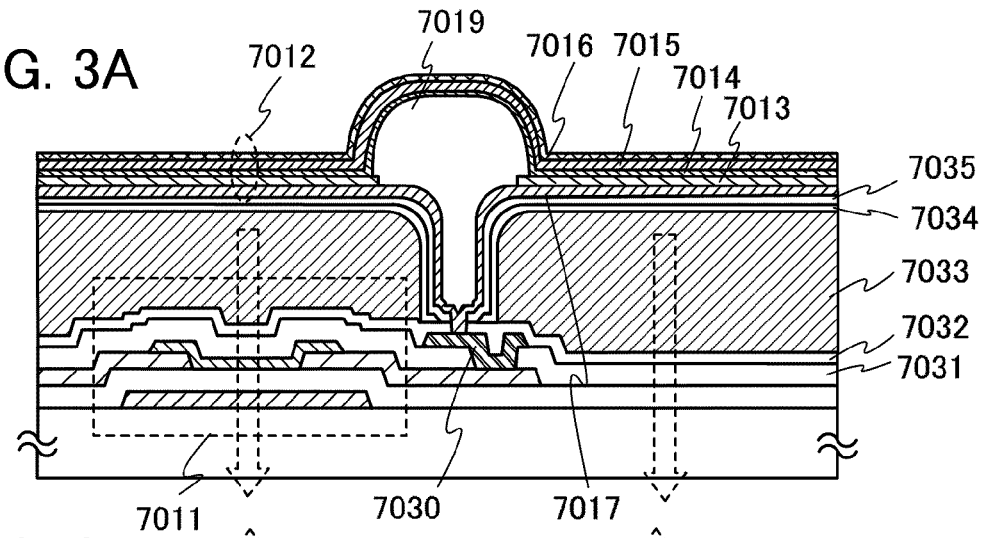
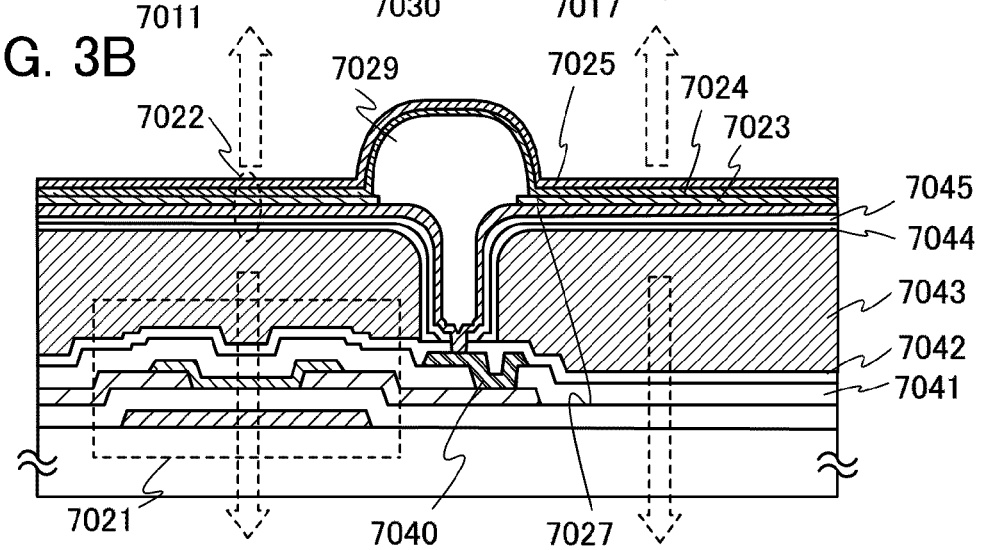
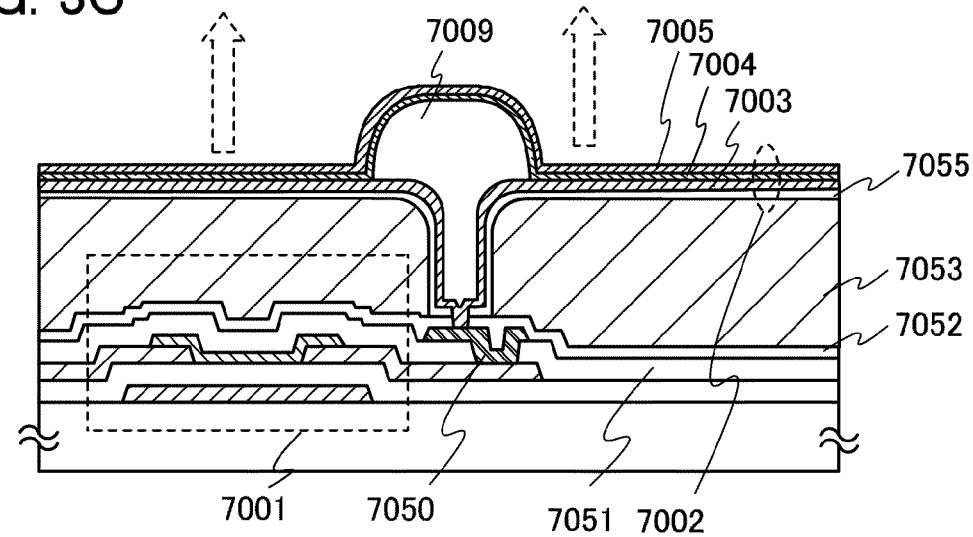

FIG. 5A1
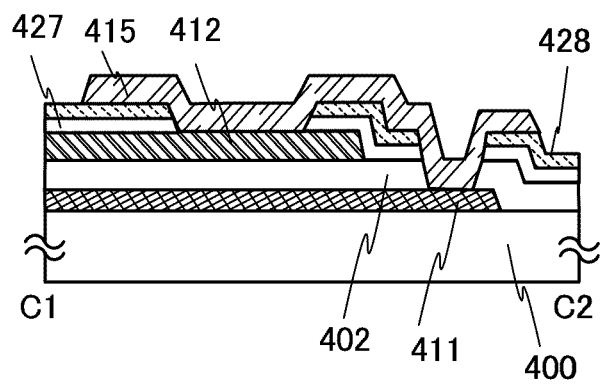
FIG. 5A2
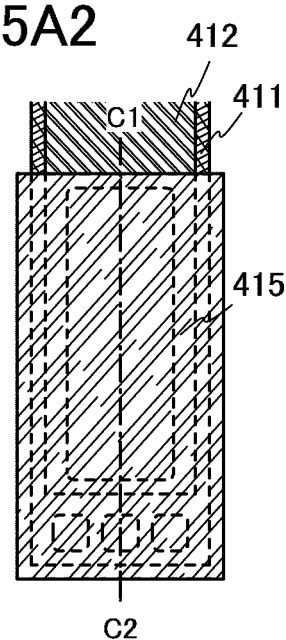
FIG. 5B1
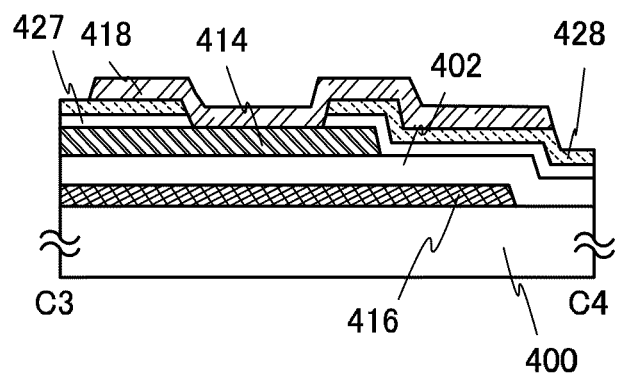
FIG. 5B2
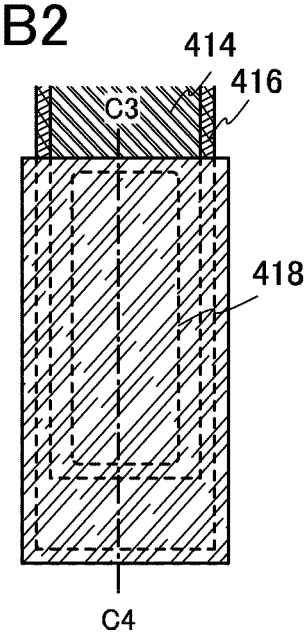

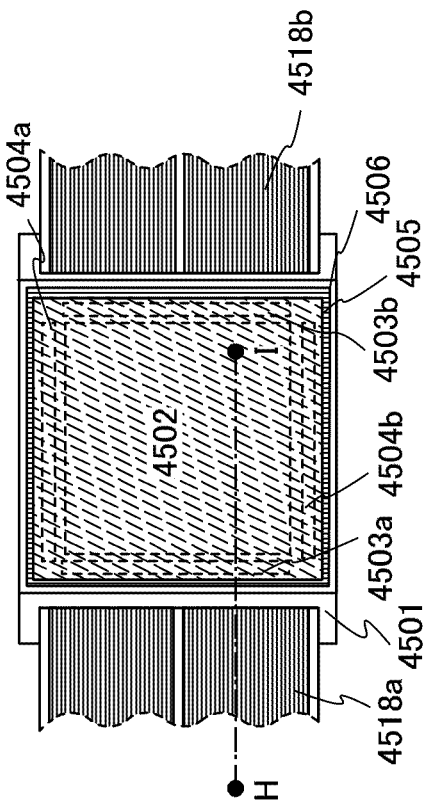
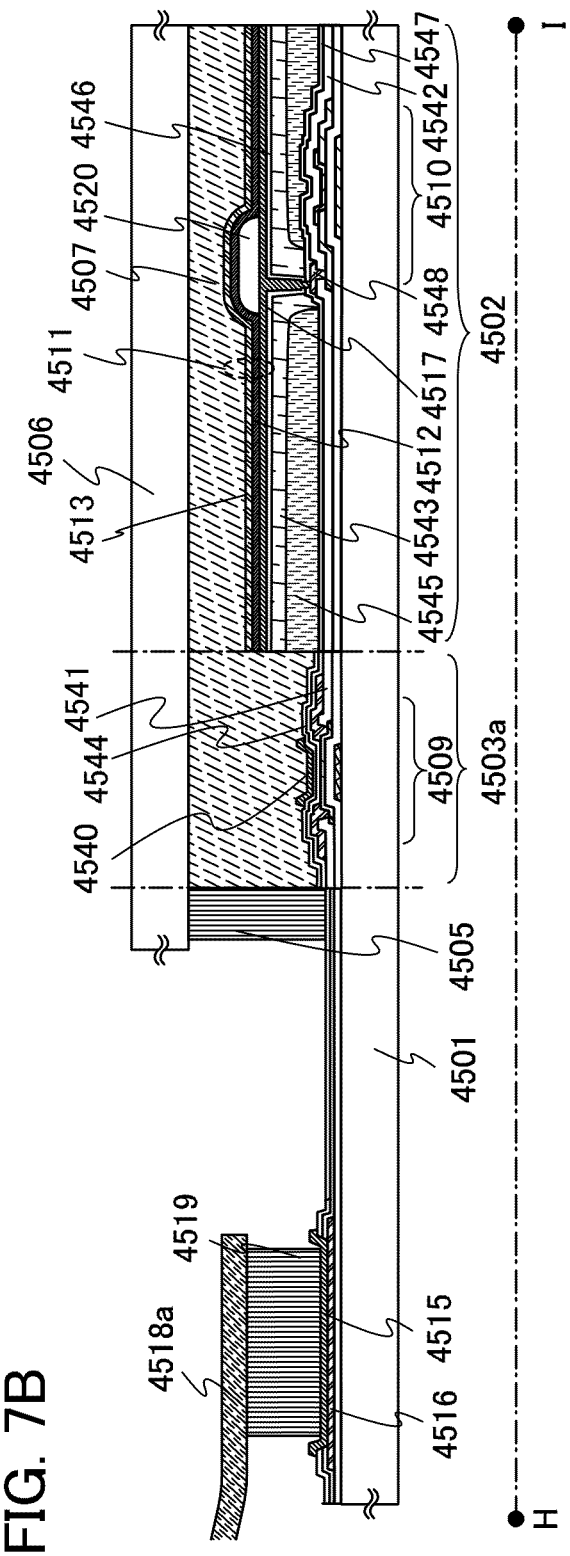
FIG. 7A
FIG. 7B

LIGHT-EMITTING DEVICE AND METHOD FOR MANUFACTURING THE SAME

TECHNICAL FIELD

The present invention relates to a light-emitting device including a layer containing an organic compound as a light-emitting layer, and a manufacturing method of the light-emitting device. For example, the present invention relates to an electronic device in which a light-emitting display device having an organic light-emitting element is mounted.

BACKGROUND ART

A light-emitting element containing an organic compound as a luminous body, which has features such as thinness, lightness, high-speed response, and DC drive at a low voltage, is expected to be applied to a next-generation flat panel display or a next-generation lighting device. In particular, display devices having light-emitting elements arranged in matrix are considered to be superior to conventional liquid crystal display devices for their wide viewing angles and excellent visibility.

It is said that light-emitting elements have a mechanism of light emission as follows: by applying voltage between a pair of electrodes with an EL layer interposed therebetween, electrons injected from a cathode and holes injected from an anode recombine with each other in an emission center of the EL layer to form molecular excitons, and energy is released when the molecular excitons relax to the ground state; accordingly light is emitted. A singlet excitation state and a triplet excitation state are known as excited states, and it is thought that light emission can be achieved through either of the excited states.

An EL layer included in a light-emitting element includes at least a light-emitting layer. In addition, the EL layer can have a stacked-layer structure including a hole-injection layer, a hole-transport layer, an electron-transport layer, an electron-injection layer, and/or the like, in addition to the light-emitting layer.

As a material having semiconductor characteristics, a metal oxide has attracted attention. Examples of such metal oxides having semiconductor characteristics are a tungsten oxide, a tin oxide, an indium oxide, a zinc oxide, and the like. A thin film transistor in which a channel formation region is formed using such a metal oxide having semiconductor characteristics is known (see Patent Documents 1 and 2).

A thin film transistor (hereinafter also referred to as a TFT) applying an oxide semiconductor has high field effect mobility. Therefore, a driver circuit of a light-emitting device or the like can be formed using the TFT.

REFERENCES

Patent Documents

[Patent Document 1] Japanese Published Patent Application No. 2007-123861
[Patent Document 2] Japanese Published Patent Application No. 2007-96055

DISCLOSURE OF INVENTION

In the case of providing a plurality of different circuits over an insulating surface, for example, when a pixel portion and a driver circuit are provided over the same substrate, a thin film transistor for a pixel portion is required to have a higher switching property like a high on/off ratio, and a thin film transistor for a driver circuit is required to have a high response speed. In particular, as the definition of a display device is improved, writing time of a displayed image is reduced. Therefore, it is preferable that the thin film transistor used for the driver circuit operate at high speed.

An object of the present invention is to provide a light-emitting device in which plural kinds of circuits are formed over the same substrate, and plural kinds of thin film transistors are provided in accordance with characteristics of the plural kinds of circuits.

Another object of an embodiment of the present invention is to manufacture a highly reliable light-emitting device, using a thin film transistor with better electric characteristics and high reliability as a switching element.

An embodiment of the present invention is a light-emitting device in which: a driver circuit portion and a display portion (also called a pixel portion) are formed over the same substrate; the driver circuit portion includes a thin film transistor for a driver circuit, in which a gate electrode layer, a source electrode layer, and a drain electrode layer are formed using a metal conductive film and a channel layer is formed using an oxide semiconductor, and a wiring for a driver circuit formed using a metal conductive film; and the display portion includes a thin film transistor for a pixel, in which a source electrode layer and a drain electrode layer are formed using an oxide conductor and a semiconductor layer is formed using an oxide semiconductor.

As the thin film transistor for a pixel and the thin film transistor for a driver circuit, bottom-gate thin film transistors are used. The thin film transistor for a pixel is an inverted-coplanar (also called a bottom-contact) thin film transistor including an oxide semiconductor layer which overlaps with a source electrode layer and a drain electrode layer.

Light-emitting elements emitting light with a plurality of colors and thin film transistors for pixels, which are electrically connected to the light-emitting elements may be formed over the same substrate, so that a light-emitting device such as a display can be manufactured.

A plurality of white emissive light-emitting elements may be provided and an optical film, specifically color filters may be provided so as to overlap with light-emitting regions of the light-emitting elements, so that a light-emitting display device capable of full-color display can be manufactured. In the case where a color filter is provided between the white emissive light-emitting element and the thin film transistor for a pixel so that display is performed by light emission passing through the color filter from the light-emitting element, an increased aperture ratio can be obtained by forming a gate electrode layer, a source electrode layer, and a drain electrode layer of the thin film transistor for a pixel using light transmitting conductive films. In this specification, the color filter refers not to a whole of a film including color filter layers with three colors (e.g., a red color filter, a blue color filter, and a green color filter) in addition to a black matrix and/or an overcoat but to a color filter with one color.

The thin film transistor for a driver circuit has a structure different from that of the thin film transistor for a pixel. The thin film transistor for a driver circuit is a bottom-gate thin film transistor in which an oxide insulating layer is provided so as to be in contact with an oxide semiconductor layer exposed between the source and drain electrode layers.

In the thin film transistor for a driver circuit: a drain electrode layer which is formed using a metal conductive film of Ti or the like is included; the drain electrode layer is in contact with part of a top surface of the oxide semiconductor layer; and a high-resistance drain region (also called an HRD region) which is oxygen-deficient is formed so as to overlap with the drain electrode layer. Specifically, the carrier concentration of the high-resistance drain region is greater than or equal to $1\times10^{18}/cm^3$ and is greater than the carrier concentration of a channel formation region (less than $1\times10^{18}/cm^3$). The carrier concentration in this specification means the carrier concentration obtained from Hall effect measurement at room temperature.

Further, a high-resistance source region (also called an HRS region) which is oxygen-deficient is formed so as to be in contact with part of the top surface of the oxide semiconductor layer and to overlap with the source electrode layer.

One embodiment of the present invention which is disclosed in this specification is a light-emitting device including, over the same substrate, a pixel portion including a first thin film transistor and a driver circuit including a second thin film transistor whose a structure is different from that of the first thin film transistor. The first thin film transistor includes: a gate electrode layer over the substrate; a gate insulating layer over the gate electrode layer; a source electrode layer and a drain electrode layer over the gate insulating layer; a first oxide semiconductor layer over the gate insulating layer so as to overlap with the source electrode layer and the drain electrode layer; and an oxide insulating layer in contact with the first oxide semiconductor layer. Further, the pixel portion includes: a connection electrode layer over the oxide insulating layer so as to be electrically connected to the drain electrode layer; a color filter layer over the oxide insulating layer; a first electrode over the color filter layer so as to be electrically connected to the connection electrode layer; a light-emitting layer over the first electrode; and a second electrode over the light-emitting layer. The second thin film transistor includes a second oxide semiconductor layer having at least a channel formation region and a peripheral portion of the second oxide semiconductor layer is in contact with the oxide insulating layer. Note that a drain electrode layer and a source electrode layer of the second thin film transistor and the channel formation region of the second oxide semiconductor layer are in contact with an insulating layer. Note also that the gate electrode layer, the gate insulating layer, the oxide semiconductor layer, the source electrode layer, the drain electrode layer, the oxide insulating layer, and the first electrode of the first thin film transistor have light-transmitting properties.

With the above structure, at least one of the above objects can be achieved.

In the above structure, the connection electrode layer is formed using a film containing an element selected from Al, Cr, Cu, Ta, Ti, Mo, and W as its main component, or a stacked-layer film including the film containing the element and an alloy film containing the element. Further, the source electrode layer and the drain electrode layer of the first thin film transistor are formed using an indium oxide, an alloy of an indium oxide and a tin oxide, an alloy of an indium oxide and a zinc oxide, or a zinc oxide.

The source and drain electrode layers of the second thin film transistor that is a thin film transistor for a driver circuit are formed using the same material as the connection electrode layer and an element selected from Ti, Mo, W, Al, Cr, Cu, and Ta, an alloy containing any of the above elements as its component, an alloy containing a combination of any of the above elements, or the like is used. Each of the source electrode layer and the drain electrode layer is not limited to a single layer containing the above-described element and may be a stack of two or more layers.

The source and drain electrode layers of the second thin film transistor do not overlap with the channel formation region of the second oxide semiconductor layer.

Further, in the above structure, the second thin film transistor includes the oxide semiconductor layer, the oxide insulating layer is provided over the oxide semiconductor layer, and the channel formation region of the oxide semiconductor layer and the peripheral portions of the oxide semiconductor layer are in contact with the oxide insulating layer.

The second thin film transistor may include an oxide conductive layer between the oxide semiconductor layer and the source electrode layer and include an oxide conductive layer between the oxide semiconductor layer and the drain electrode layer. With this structure, the contact resistance can be reduced, which leads to a thin film transistor capable of high-speed operation. It is preferable that the oxide conductive layer be a layer not containing an indium oxide but containing a zinc oxide as a component. As materials of such an oxide conductive layer, a zinc oxide, a zinc aluminum oxide, a zinc aluminum oxynitride, a zinc gallium oxide, and the like can be given.

As an oxide semiconductor layer, a thin film of a material expressed by $InMO_3(ZnO)_m$ (m>0 and m is not an integer) is formed, and a thin film transistor including the thin film as an oxide semiconductor layer is manufactured. Note that M denotes one or more metal elements selected from Ga, Fe, Ni, Mn, and Co. For example, M might be Ga or might be Ga and the above metal element other than Ga; for example, M might be Ga and Ni or Ga and Fe. Further, in the oxide semiconductor, in some cases, a transition metal element such as Fe or Ni or an oxide of the transition metal is contained as an impurity element in addition to the metal element contained as M. In this specification, among oxide semiconductor layers whose composition formulae are expressed by $InMO_3(ZnO)_m$ (m>0 and m is not an integer), an oxide semiconductor which contains Ga as M is referred to as an In—Ga—Zn—O-based oxide semiconductor, and a thin film of the In—Ga—Zn—O-based oxide semiconductor is referred to as an In—Ga—Zn—O-based film.

As a metal oxide used for the oxide semiconductor layer, any of the following metal oxides can be used in addition to the above: an In—Sn—O-based metal oxide; an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. A silicon oxide may be contained in an oxide semiconductor layer which is formed using the above metal oxide.

In addition, one embodiment of the present invention is a manufacturing method of a light-emitting device including the steps of: forming a first gate electrode layer and a second gate electrode layer over a substrate having an insulating surface; forming a gate insulating layer over the first gate electrode layer and the second gate electrode layer; forming a first source electrode layer and a first drain electrode layer over the gate insulating layer so as to overlap with the first gate electrode layer; forming over the gate insulating layer, a first oxide semiconductor layer overlapping with the first gate electrode layer, part of the first source electrode layer, and part of the first drain electrode layer, and a second oxide semiconductor layer overlapping with the second gate electrode layer; forming an oxide insulating layer in contact with a peripheral portion of the second oxide semiconductor layer and in contact with a top surface and a side surface of the first oxide semiconductor layer; forming a second source electrode layer and a second drain electrode layer over the second oxide semiconductor layer, and a connection electrode layer over the oxide insulating layer so as to be electrically connected to the first drain electrode layer; forming an insulating layer in contact with the second source electrode layer, the second drain electrode layer, the second oxide semiconductor layer, and the connection electrode layer; forming a color filter layer over the oxide insulating layer overlapping with the first oxide semiconductor layer; and forming over the color filter layer, a first electrode electrically connected to the connection electrode layer, a light-emitting layer, and a second electrode.

Note that the ordinal numbers such as "first" and "second" in this specification are used for convenience and do not denote the order of steps and the stacking order of layers. In addition, the ordinal numbers in this specification do not denote particular names which specify the present invention.

In the structure of the above-described manufacturing method, the oxide insulating layer which is in contact with the first oxide semiconductor layer and the second oxide semiconductor layer is formed without being exposed air so as to prevent entry of water or hydrogen into the oxide semiconductor layers after the oxide semiconductor layers are dehydrated or dehydrogenated.

The dehydration or dehydrogenation is performed by heat treatment in an inert gas atmosphere containing nitrogen or a rare gas (such as argon or helium) at a temperature higher than or equal to 350° C., preferably, a temperature higher than or equal to 400° C. and lower than the strain point of the substrate, or a temperature higher than or equal to 425° C. and lower than or equal to 700° C., thereby reducing an impurity such as moisture or hydrogen contained in the oxide semiconductor layer. In this specification, "dehydrogenation" does not indicate elimination of only $H_2$ by heat treatment. For convenience, elimination of H, OH, and the like is referred to as "dehydration or dehydrogenation".

Some of hydrogen or water which may be contained in an oxide semiconductor layer depending on a film formation method thereof serve as donors supplying electrons. In the case of performing heat treatment in an inert gas atmosphere containing nitrogen or a rare gas (such as argon or helium), the hydrogen which has been contained in the oxide semiconductor layer is eliminated. At the same time, the oxide semiconductor layer is changed into an oxygen-deficient oxide semiconductor layer by this heat treatment so as to be a low-resistance oxide semiconductor layer, i.e., an n-type (e.g., $n^-$-type) oxide semiconductor layer. Then, the oxide semiconductor layer is made to be in an oxygen-excess state by treatment in an oxygen atmosphere at a proper temperature or by the formation of the oxide insulating film which is to be in contact with the oxide semiconductor layer; accordingly, the oxide semiconductor layer can be changed into a high-resistance oxide semiconductor layer, i.e., an i-type oxide semiconductor layer. In this manner, a semiconductor device including a highly reliable thin film transistor having favorable electric characteristics and high reliability can be provided.

The conditions of the dehydration or dehydrogenation are determined such that at least a peak at around 300° C. of two peaks derived from water is not detected when the oxide semiconductor layer subjected to the dehydration or dehydrogenation is measured with thermal desorption spectroscopy (TDS) while the temperature is increased to 450° C. Therefore, even when the thin film transistor using the oxide semiconductor layer subjected to the above dehydration or dehydrogenation is measured with TDS while the temperature is increased to 450° C., at least a peak derived from water at around 300° C. is not detected.

It is important that the heating temperature at which the oxide semiconductor layer is dehydrated or dehydrogenated is deceased to room temperature in the same furnace used for the dehydration or dehydrogenation with the oxide semiconductor layer prevented from being exposed to air so that entry of an impurity such as water or hydrogen into the oxide semiconductor layer is prevented. When a thin film transistor is manufactured using an oxide semiconductor layer obtained by performing dehydration or dehydrogenation to change an oxide semiconductor layer into a low-resistance oxide semiconductor layer, i.e., an n-type (e.g., $n^-$-type or $n^+$-type) oxide semiconductor layer and then by changing the layer into a high-resistance oxide semiconductor layer, i.e., an i-type oxide semiconductor layer, the threshold voltage of the thin film transistor can be a positive voltage, whereby a so-called normally-off switching element can be realized. It is preferable that a channel in a display device be formed with a positive threshold voltage which is as close to 0 V as possible in a thin film transistor. Note that if the threshold voltage of the thin film transistor is negative, the thin film transistor tends to be normally-on; in other words, current flows between a source electrode and a drain electrode even when the gate voltage is 0 V. In an active matrix display device, the electric characteristics of a thin film transistor included in a circuit are important and influence the performance of the display device. Among the electric characteristics of the thin film transistor, the threshold voltage ($V_{th}$) is particularly important. A high or negative threshold voltage makes the circuit using the transistor difficult to be controlled even when the field effect mobility is high. In the case where a thin film transistor has a large absolute value of its threshold voltage, the thin film transistor cannot perform a switching function as the TFT and might be a load when the TFT is driven at a low voltage. In the case of an n-channel thin film transistor, it is preferable that a channel be formed and drain current flow only after a positive voltage is applied as a gate voltage. A transistor in which a channel is not formed unless driving voltage is high enough and a transistor in which a channel is formed and drain current flows even when a negative voltage is applied are unsuitable as a thin film transistor used in a circuit.

In addition, the gas atmosphere in which the temperature at which the dehydration or dehydrogenation is performed is lowered to room temperature may be switched to a gas atmosphere which is different from the gas atmosphere in which the dehydration or dehydrogenation is performed. For example, after the dehydration or dehydrogenation is performed in a furnace, cooling may be performed with the furnace filled with a high-purity oxygen gas, a high-purity $N_2O$ gas, or an ultra dry air (with a dew point lower than or equal to −40° C., preferably lower than or equal to −60° C.) with the oxide semiconductor layer prevented from being exposed to air.

The electric characteristics of a thin film transistor are improved using an oxide semiconductor film obtained by the heat treatment for dehydration or dehydrogenation which reduces moisture contained in the film and then the slow cooling (or cooling) in a dry atmosphere which contains moisture as less as possible (with a dew point of lower than or equal to −40° C., preferably lower than or equal to −60° C.), and a high-performance thin film transistor which can be mass-produced is realized.

In a light-emitting display device in which a light-emitting element is used, a pixel portion includes a plurality of thin film transistors. The pixel portion includes a region where a gate electrode of one thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

Since a thin film transistor is easily broken due to static electricity or the like, a protective circuit for protecting the thin film transistor provided in the pixel portion is preferably provided over the same substrate as a gate line or a source line. The protective circuit is preferably formed with a non-linear element including an oxide semiconductor layer.

In a light-emitting device which is one embodiment of the present invention, a driver circuit portion including a driver circuit TFT and a display portion including a pixel TFT are formed over the same substrate. Therefore, manufacturing cost of the light-emitting device can be reduced.

Further, according to one embodiment of the present invention, a light-emitting device such as a lighting device can be manufactured by forming a white emissive light-emitting element over a substrate. As a lighting device, a light-emitting element which includes a layer containing a light-emitting substance with which electroluminescence (hereinafter referred to as EL) can also be used.

By using an oxide semiconductor layer which is subjected to heat treatment for dehydration or dehydrogenation, a highly reliable light-emitting device using a thin film transistor having better electric characteristics and high reliability can be manufactured. A light-emitting device in which a TFT for a pixel and a TFT for a driver circuit which have different structures in accordance with their circuits are provided over the same substrate can be manufactured.

BRIEF DESCRIPTION OF DRAWINGS

In the accompanying drawings:
FIGS. 3A to 3C are cross-sectional views each illustrating one embodiment of the present invention;
FIGS. 5A1 and 5B1 are cross-sectional views and FIGS. 5A2 and 5B2 are plan views illustrating one embodiment of the present invention;
FIG. 7A is a plan view and FIG. 7B is a cross-sectional view illustrating one embodiment of the present invention.

BEST MODE FOR CARRYING OUT THE INVENTION

Figure 1A:
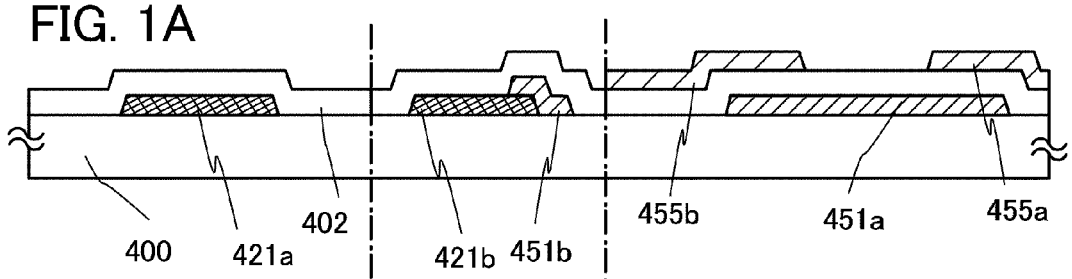
FIGS. 1A to 1D are cross-sectional process views illustrating one embodiment of the present invention.

Hereinafter, embodiments of the present invention will be described in detail with reference to the drawings. Note that the present invention is not limited to the description below, and it is easily understood by those skilled in the art that modes and details disclosed herein can be modified in various ways without departing from the spirit and scope of the present invention. Therefore, the present invention is not construed as being limited to description of the embodiments. In the drawings of this specification, the same portions or portions having the same function or a similar function are denoted by the same reference numerals, and description thereon may be omitted.

Embodiment 1

In this embodiment, one embodiment of a light-emitting device and a method for manufacturing the light-emitting device is described with reference to FIGS. 1A to 1D. FIG. 1D illustrates an example of cross-sectional structures of two thin film transistors having different structures which are manufactured over the same substrate.

A thin film transistor 450 illustrated in FIG. 1D has a bottom-gate structure called a channel-etched type. A thin film transistor 460 has a bottom-gate structure called a bottom-contact type (also referred to as an inverted-coplanar type).

The thin film transistor 460 provided in a pixel is a bottom-contact thin film transistor which includes, over a substrate 400 having an insulating surface, a gate electrode layer 451a, a gate insulating layer 402, an oxide semiconductor layer 454 including a channel formation region, a source electrode layer 455a, and a drain electrode layer 455b. In addition, an oxide insulating layer 426 is provided so as to cover the thin film transistor 460 and be in contact with a top surface and a side surface of the oxide semiconductor layer 454.

Further, although a single-gate thin film transistor is used as an example of the thin film transistor 460 provided in a pixel for description, a multi-gate thin film transistor including a plurality of channel formation regions can be alternatively used as needed.

The oxide semiconductor layer 454 is formed over the source electrode layer 455a and the drain electrode layer 455b and partly overlaps with them. Further, the oxide semiconductor layer 454 overlaps with the gate electrode layer 451a with the gate insulating layer 402 interposed therebetween. A channel formation region of the thin film transistor 460 provided in a pixel is a region of the oxide semiconductor layer 454, between a side surface of the source electrode layer 455a and a side surface of the drain electrode layer 455b which face each other, that is, a region of the oxide semiconductor layer 454, which is in contact with the gate electrode layer 402 and overlaps with the gate electrode layer 451a.

Further, in order to realize a light-emitting device with a high aperture ratio, in which a thin film transistor having a light-transmitting property is used as the thin film transistor 460, a light-transmitting conductive film is used for each of the source electrode layer 455a and the drain electrode layer 455b.

Further, the gate electrode layer 451a of the thin film transistor 460 is also formed using a light-transmitting conductive film. In this specification, a film having a light-transmitting property to visible light refers to a film with a thickness which realizes a light transmittance to visible light of 75% to 100%, which is also referred to as a transparent conductive film in the case where the film has conductivity. Alternatively, a conductive film which is semitransparent to visible light may be used. When a conductive film is semitransparent to visible light, it has a transmittance of visible light of 50% to 75%.

The thin film transistor 450 provided in a driver circuit includes, over the substrate 400 having an insulating surface, a gate electrode layer 421a, the gate insulating layer 402, an oxide semiconductor layer including at least a channel formation region 423, a high-resistance source region 424a, and a high-resistance drain region 424b, a source electrode layer 425a, and a drain electrode layer 425b. Further, an insulating layer 427 is provided to be in contact with the source electrode layer 425a, the drain electrode layer 425b, and the channel formation region 423.

A first region 424c and a second region 424d of the oxide semiconductor layer, which overlap with the oxide insulating layer 426, are in an oxygen-excess state like the channel formation region 423; thus, the leak current can be reduced and the parasitic capacitance can be reduced.

Hereinafter, the process for manufacturing the thin film transistors 450 and 460 over the same substrate is described with reference to FIGS. 1A to 1D.

First, a conductive film is formed over the substrate 400 having an insulating surface and a first photolithography step is performed to form the gate electrode layers 421a and 421b.

A resist mask may be formed by an ink-jet method; in that case, the manufacturing cost can be reduced because a photomask is not used.

As a material of the conductive film for forming the gate electrode layers 421a and 421b, the following can be used: an element selected from Al, Cr, Ta, Ti, Mo, and W; an alloy including the above element as a component; an alloy film including any of these elements in combination; or the like.

In the case where a glass substrate is used and the temperature at which the heat treatment is performed later is high, it is preferable to use a glass substrate whose strain point is higher than or equal to 730° C. As a glass substrate, a glass material such as aluminosilicate glass, aluminoborosilicate glass, or barium borosilicate glass is used, for example. In general, by containing barium oxide (BaO) and boric acid so that the amount of barium oxide is larger than that of boric acid, a glass substrate is heat-resistant and of more practical use.

Note that a substrate formed using an insulator such as a ceramic substrate, a quartz substrate, or a sapphire substrate may be used instead of the glass substrate. Crystallized glass or the like may be used as well.

An insulating film serving as a base film may be provided between the substrate 400 and the gate electrode layers 421a and 421b. The base film has a function of preventing diffusion of an impurity element from the substrate 400, and can be formed using a single layer or stacked layers using one or more of a silicon nitride film, a silicon oxide film, a silicon nitride oxide film, and a silicon oxynitride film.

Next, a light-transmitting conductive film is formed so as to cover the gate electrode layers 421a and 421b and then a second photolithography step is performed to form the gate electrode layer 451a and a gate electrode layer 451b. In this embodiment, in order to reduce the wiring resistance, a gate wiring provided in the pixel portion is formed using the same metal conductive film as the gate electrode layer 421b, and a light-transmitting conductive film is used for formation of the gate electrode layer 451a which overlaps with the oxide semiconductor layer formed later with the gate insulating layer 402 interposed therebetween.

Next, the gate insulating layer 402 is formed over the gate electrode layers 421a, 421b, 451a, and 451b.

The gate insulating layer 402 can be formed using a single layer or stacked layers using one or more of a silicon oxide layer, a silicon nitride layer, a silicon oxynitride layer, and a silicon nitride oxide layer by a plasma CVD method, a sputtering method, or the like. For example, a silicon oxynitride layer may be formed by a plasma CVD method using SiH$_4$, oxygen, and nitrogen as a film formation gas. The thickness of the gate insulating layer 402 is greater than or equal to 100 nm and less than or equal to 500 nm In the case where the gate insulating layer 402 is formed using stacked layers, a first gate insulating layer with a thickness greater than or equal to 50 nm and less than or equal to 200 nm and a second gate insulating layer with a thickness greater than or equal to 5 nm and less than or equal to 300 nm are stacked in this order, for example.

In this embodiment, the gate insulating layer 402 is a silicon oxynitride (SiON (composition ratio: N<O)) layer with a thickness of 100 nm which is formed by a plasma CVD method.

Next, a light-transmitting conductive film is formed over the gate insulating layer 402, and then a third photolithography step is performed to form the source electrode layer 455a and the drain electrode layer 455b (see FIG. 1A). As a material of the light-transmitting conductive film, a conductive material that transmits visible light such as an In—Sn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be employed, and the film thickness thereof is selected in the range of 50 nm to 300 nm inclusive. When a sputtering method is employed, it is preferable that film deposition be performed using a target containing SiO$_2$ of 2 to 10 percent by weight inclusive so that SiO$_x$ (x>0) which inhibits crystallization be contained in the light-transmitting conductive film, thereby preventing crystallization at the time of heat treatment for dehydration or dehydrogenation in a later step.

Next, the gate insulating layer 402 is selectively etched by a fourth photolithography step, so that a contact hole reaching the gate electrode layer 421b is formed.

An oxide semiconductor film with a thickness greater than or equal to 5 nm and less than or equal to 200 nm, preferably greater than or equal to 10 nm and less than or equal to 20 nm is formed over the gate insulating layer 402. The thickness is preferably as thin as less than or equal to 50 nm in order that the oxide semiconductor film remain in an amorphous state even when heat treatment for dehydration or dehydrogenation is performed after the formation of the oxide semiconductor film. The small thickness of the oxide semiconductor film makes it possible to prevent the oxide semiconductor film 480 from being crystallized when heat treatment is performed after the formation of the oxide semiconductor layer.

Any of the following is used as the oxide semiconductor film: an In—Ga—Zn—O-based oxide semiconductor film, an In—Sn—Zn—O-based oxide semiconductor film, an In—Al—Zn—O-based oxide semiconductor film, a Sn—Ga—Zn—O-based oxide semiconductor film, an Al—Ga—Zn—O-based oxide semiconductor film, a Sn—Al—Zn—O-based oxide semiconductor film, an In—Zn—O-based oxide semiconductor film, a Sn—Zn—O-based oxide semiconductor film, an Al—Zn—O-based oxide semiconductor film, an In—O-based oxide semiconductor film, a Sn—O-based oxide semiconductor film, and a Zn—O-based oxide semiconductor film. The oxide semiconductor film can be formed by a sputtering method in a rare gas (typically argon) atmosphere, an oxygen atmosphere, or an atmosphere containing a rare gas (typically argon) and oxygen. When a sputtering method is employed, it is preferable that film deposition be performed using a target containing $SiO_2$ of 2 to 10 percent by weight inclusive so that $SiO_x$ (x>0) which inhibits crystallization be contained in the oxide semiconductor film, thereby preventing crystallization at the time of heat treatment for dehydration or dehydrogenation in a later step.

In this embodiment, film deposition is performed using an oxide semiconductor target including In, Ga, and Zn ($In_2O_3$:$Ga_2O_3$:ZnO=1:1:1 [mol ratio]) under the following condition: the distance between a substrate and a target is 100 mm, the pressure is 0.6 Pa, the direct-current (DC) power supply is 0.5 kW, and the atmosphere is oxygen (the flow rate of oxygen is 100%). It is preferable that a pulsed direct-current (DC) power supply be used because powder substances (also referred to as particles or dust) can be reduced and the film thickness can be uniform. In this embodiment, as the oxide semiconductor film, a 15-nm-thick In—Ga—Zn—O-based oxide semiconductor film is formed by a sputtering method using an In—Ga—Zn—O-based oxide semiconductor target.

Examples of a sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating film, and a DC sputtering method is mainly used in the case of forming a metal conductive film.

There is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

Alternatively, a sputtering apparatus provided with a magnet system inside the chamber and used for a magnetron sputtering method, or a sputtering apparatus used for an ECR sputtering method in which plasma generated with the use of microwaves is used without using glow discharge can be used.

As the deposition method using a sputtering method, a reactive sputtering method in which a target substance and a sputtering gas component are chemically reacted with each other during deposition to form a thin film of a compound thereof, or a bias sputtering method in which a voltage is also applied to a substrate during deposition can be used.

It is preferable that before the oxide semiconductor film is formed by a sputtering method, dust on a surface of the gate insulating layer 402 be removed by reverse sputtering in which an argon gas is introduced and plasma is generated. The reverse sputtering refers to a method in which, without application of a voltage to a target side, an RF power source is used for application of a voltage to a substrate side in an argon atmosphere so that plasma is formed to modify a surface of the substrate. Note that instead of an argon atmosphere, nitrogen, helium, oxygen, or the like may be used.

In this embodiment, the gate insulating layer is selectively etched by the fourth photolithography step to form the contact hole reaching the gate electrode layer 421b; however, the present invention is not particularly limited thereto. The contact hole reaching the gate electrode layer 421b may be alternatively formed by using a resist mask formed over an oxide semiconductor layer after the oxide semiconductor film is etched; in that case, it is preferable that reverse sputtering be performed to remove resist residue or the like attached on the surface of the oxide semiconductor layer and the gate insulating layer 402.

Alternatively, the following may be performed: after an oxide semiconductor film is formed over the gate insulating layer, a resist mask is formed over the oxide semiconductor film so as to form a contact hole reaching the gate electrode layer 421b; the resist mask is removed; a resist mask is then formed over the oxide semiconductor film so that the oxide semiconductor film is selectively etched and processed into an island-shaped oxide semiconductor layer.

Further, before the oxide semiconductor film is formed, heat treatment (at higher than or equal to 400° C. and lower than the strain point of the substrate) may be performed in an inert gas atmosphere (e.g., nitrogen, helium, neon, or argon), thereby removing an impurity such as hydrogen or water contained in the gate insulating layer.

In this embodiment, the contact hole reaching the gate electrode layer 421b is formed by selectively etching the gate insulating layer by the fourth photolithography step; therefore, it is preferable that heat treatment (at higher than or equal to 400° C. and lower than the strain point of the substrate) in an inert gas atmosphere (e.g., nitrogen, helium, neon, or argon) be performed after the formation of the contact hole so as to remove an impurity such as hydrogen or water contained in the gate insulating layer and the oxide semiconductor film be then formed.

Then, the oxide semiconductor film is processed into island-shaped oxide semiconductor layers by a fifth photolithography step. A resist mask used for forming the island-shaped semiconductor layers may be formed by an ink-jet method; in that case, the manufacturing cost can be reduced because a photomask is not used.

Next, dehydration or dehydrogenation of the oxide semiconductor layer is performed. First heat treatment for dehydration or dehydrogenation is performed at a temperature higher than or equal to 400° C. and lower than or equal to 700° C., preferably higher than or equal to 425° C. or more preferably, higher than or equal to 650° C. In the case where the temperature is higher than or equal to 425° C., the heat treatment time may be one hour or shorter, whereas in the case where the temperature is lower than 425° C., the heat treatment time is longer than one hour. Here, the oxide semiconductor layers are obtained in such a manner that: the substrate is introduced into an electric furnace that is a kind of heat treatment apparatus; the oxide semiconductor layers are subjected to the heat treatment in a nitrogen atmosphere; and after that, the oxide semiconductor layer is not exposed to air, which prevents water or hydrogen from entering the oxide semiconductor layer. In this embodiment, one furnace is used up to the time when the temperature is lowered from the heat temperature T at which the dehydration or dehydrogenation of the oxide semiconductor layer is performed to the temperature enough to prevent entry of water; specifically, slow cooling is performed in a nitrogen atmosphere up to the time when the temperature becomes lower than or equal to (T−100)° C. Without being limited to a nitrogen atmosphere, an atmosphere may be a rare gas atmosphere (such as helium, neon, or argon) may be employed in the dehydration or dehydrogenation.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus, or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the gas, an inert gas which does not react with a process object by heat treatment, such as nitrogen or a rare gas such as argon is used.

In the first heat treatment, it is preferable that water, hydrogen, or the like be not contained in nitrogen or a rare gas such as helium, neon, or argon. The purity of nitrogen or a rare gas such as helium, neon, or argon which is introduced into the heat treatment apparatus is preferably 6N (99.9999%) or more, more preferably 7N (99.99999%) or more (i.e., the concentration of impurities is preferably 1 ppm or less, more preferably 0.1 ppm or less).

Further, the oxide semiconductor layer may be crystallized to be a microcrystalline film or a polycrystalline film depending on a condition of the first heat treatment or a material of the oxide semiconductor layer. For instance, the oxide semiconductor layer may be crystallized to be a microcrystalline semiconductor film having a degree of crystallization of 90% or more, or 80% or more. Further, depending on the condition of the first heat treatment and the material of the oxide semiconductor layer, the oxide semiconductor layer may be an amorphous oxide semiconductor film containing no crystalline component.

Figure 1B:
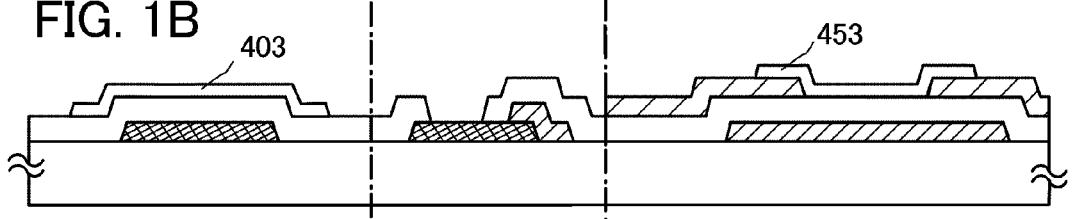
Figure 1C:
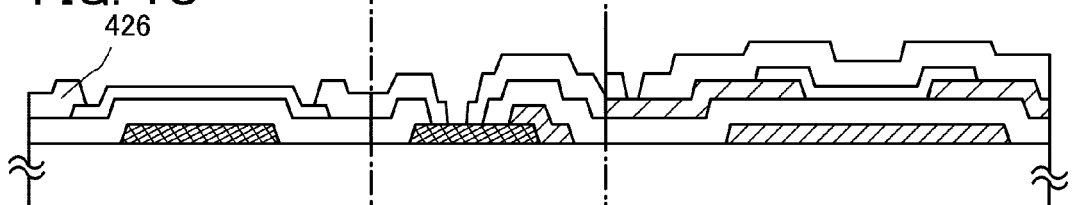
Figure 1D:
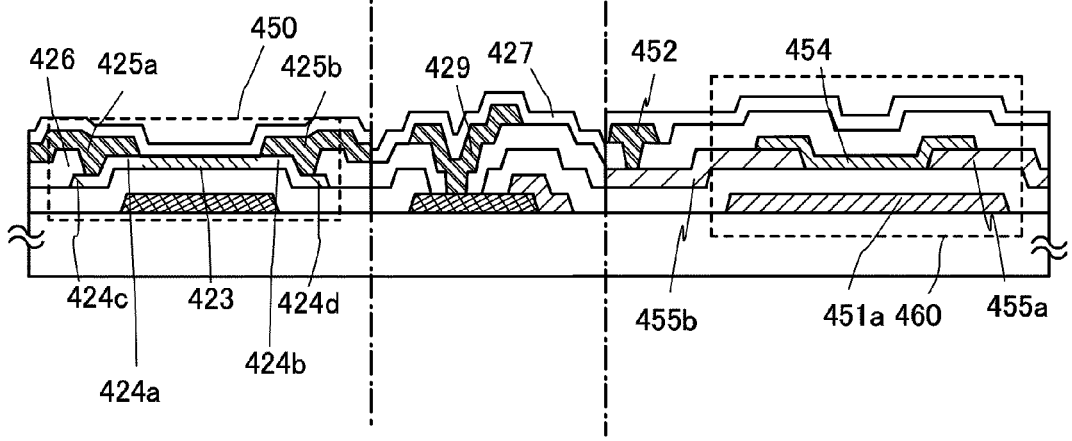

After the first heat treatment, an oxide semiconductor layer 403 and an oxide semiconductor layer 453 which are oxygen-deficient and low-resistance oxide semiconductor layers are obtained (see FIG. 1B). The carrier concentration after the first heat treatment is higher than that of the oxide semiconductor film just after being deposited, and it is preferable that the oxide semiconductor layers 403 and 453 each have a carrier concentration greater than or equal to $1 \times 10^{18}/cm^3$. Further, the gate electrode layers 451a and 451b each may be crystallized to be a microcrystalline film or a polycrystalline film depending on a condition of the first heat treatment, or a material thereof. For example, in the case where films of an alloy of an indium oxide and a tin oxide are used as the gate electrode layers 451a and 451b, they are crystallized by the first heat treatment at 450° C. for one hour, whereas in the case where films of an alloy of an indium oxide and a tin oxide containing a silicon oxide are used as the gate electrode layers 451a and 451b, they are not easily crystallized.

The first heat treatment of the oxide semiconductor layer may be performed on the oxide semiconductor film before being processed into the island-shaped oxide semiconductor layers. In that case, after the first heat treatment, the substrate is taken out of the heat treatment apparatus and subjected to the fifth photolithography step.

Next, an oxide insulating film is formed over the gate insulating layer 402 and the oxide semiconductor layers 403 and 453 by a sputtering method. Then, a resist mask is formed by a sixth photolithography step, and selective etching is performed to form the oxide insulating layer 426. After that, the resist mask is removed. At this stage, a region that overlaps with the oxide insulating layer 426 covering the peripheral portion and side surface of the oxide semiconductor layer is formed. By the sixth photolithography step, a contact hole reaching the gate electrode layer 421b and a contact hole reaching the drain electrode layer 455b are also formed.

The oxide insulating film can be formed to a thickness at least 1 nm or more by a method by which an impurity such as water or hydrogen is not mixed into the oxide insulating film, such as a sputtering method, as appropriate. In this embodiment, a silicon oxide film is formed by a sputtering method, as the oxide insulating film. The substrate temperature in the film deposition may be higher than or equal to room temperature and lower than or equal to 300° C.; in this embodiment, the substrate temperature is 100° C. The deposition of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method in an atmosphere of oxygen and a rare gas. As the oxide insulating film formed in contact with the low-resistance oxide semiconductor layer, an inorganic insulating film that does not contain an impurity such as moisture, a hydrogen ion, or OH⁻ and blocks entry of these from the outside may be used. Typically, a silicon oxide film, a silicon nitride oxide film, an aluminum oxide film, an aluminum oxynitride film, or the like is used.

In this embodiment, the oxide insulating film is formed by a pulsed DC sputtering method using a columnar polycrystalline, boron-doped silicon target which has a purity of 6N (the resistivity is 0.01 Ωcm), in which the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, a conductive film is formed over the gate insulating layer 402, the oxide insulating layer 426, and the oxide semiconductor layer 403. After that, by a seventh photolithography step, a resist mask is formed and selective etching is performed to form the source electrode layer 425a and the drain electrode layer 425b (see FIG. 1D). Further, as illustrated in FIG. 1D, a connection electrode layer 429 and a connection electrode layer 452 which are electrically connected to the gate electrode layer 421b and the drain electrode layer 455b, respectively, are formed. As the deposition method of the conductive film, a sputtering method, a vacuum evaporation method (e.g., an electron beam evaporation method), an arc discharge ion plating method, or a spray method is used. As a material of the conductive film, an element selected from Ti, Mo, W, Al, Cr, Cu, and Ta, an alloy containing any of the above elements as a component, an alloy containing a combination of any of the above elements, or the like is used. The conductive film is not limited to a single layer containing the above-described element and may be a stack of two or more layers. In this embodiment, a three-layer conductive film in which a titanium film (with a thickness of 100 nm), an aluminum film (with a thickness of 200 nm), and a titanium film (with a thickness of 100 nm) are stacked is formed. Instead of a titanium film, a titanium nitride film may be used.

By the seventh photolithography step, only part of the conductive film which is on and in contact with the oxide semiconductor layer is selectively removed. Therefore, by using an ammonia peroxide mixture (hydrogen peroxide water at 31 wt %: ammonia water at 28 wt %: water=5:2:2), or the like as an alkaline etchant, the metal conductive film can be selectively removed to leave the oxide semiconductor layers including an In—Ga—Zn—O-based oxide semiconductor.

A resist mask for forming the source electrode layer 425a and the drain electrode layer 425b may be formed by an ink-jet method; in that case, the manufacturing cost can be reduced because a photomask is not used.

Next, the insulating layer 427 is formed over the oxide insulating layer 426, the source electrode layer 425a, the drain electrode layer 425b, the connection electrode layer 429, and the connection electrode layer 452 (see FIG. 1D). As the insulating layer 427, a silicon oxide film, a silicon nitride oxide film, an aluminum oxide film, an aluminum oxynitride film, or the like is used. In this embodiment, a silicon oxide film is formed as the insulating layer 427 by an RF sputtering method.

After the insulating layer 427 is formed, second heat treatment (preferably at a temperature higher than or equal to 200° C. and lower than or equal to 400° C., for example at a temperature higher than or equal to 250° C. and lower than or equal to 350° C.) is performed in an inert gas atmosphere or a nitrogen gas atmosphere. For example, second heat treatment in a nitrogen atmosphere at 250° C. for one hour is performed. According to the second heat treatment, heat is applied while an end portion of the oxide semiconductor layer 403 which overlaps with the oxide insulating layer 426, part of the oxide semiconductor layer 403 which overlaps with the insulating layer 427 containing an oxide, and the oxide semiconductor layer 453 are each in contact with one of the insulating layers. Further, according to the second heat treatment, the oxide semiconductor layer whose resistance is reduced by the first heat treatment is in an oxygen-excess state and can be changed into a high-resistance oxide semiconductor layer (an i-type oxide semiconductor layer). Here, in the case where the oxide semiconductor layer has a thickness less than or equal to 15 nm, in the oxide semiconductor layer overlapping with the source electrode layer 425a and the drain electrode layer 425b which are formed using the metal conductive film, oxygen moves easily to the metal conductive film side; thus, the entire layer is an n-type oxide semiconductor layer. On the other hand, in the case where the oxide semiconductor layer has a thickness ranging from 30 nm to 50 nm, part of the oxide semiconductor layer, which is near an interface between the oxide semiconductor layer and the metal conductive film, is made to have n-type conductivity but part of the oxide semiconductor layer, which is below the n-type oxide semiconductor layer becomes intrinsic or an $n^-$-type region.

In the above manner, the first region 424c, the second region 424d, the channel formation region 423, and the oxide semiconductor layer 454 are in an oxygen-excess state and made to have an increased resistance (i.e., the regions and layer become intrinsic). As for the high-resistance source region 424a formed between the first region 424c and the channel formation region 423 and the high-resistance drain region 424b formed between the second region 424d and the channel formation region 423, the entire regions are n-type regions when the oxide semiconductor layer 403 has a thickness less than or equal to 15 nm; on the other hand, when the oxide semiconductor layer 403 has a thickness ranging from 30 nm to 50 nm, parts of the high-resistance source and drain regions, which are near the interfaces between the regions and the metal conductive film are made to have n-type conductivity but parts of the high-resistance source and drain regions 424a and 424b, which are below the parts near the interfaces, become intrinsic or $n^-$-type regions.

Note that although the second heat treatment is performed just after the formation of the silicon oxide film in this embodiment, the present invention is not limited to this timing The second heat treatment may be performed at any time after the formation of the silicon oxide film.

Although not illustrated, a planarizing insulating layer may be provided between the insulating layer 427 and the protective insulating layer 428 in the pixel portion. The planarizing insulating layer can be formed using an organic material having heat resistance, such as an acrylic resin, polyimide, a benzocyclobutene resin, polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarizing insulating layer may be formed by stacking a plurality of insulating films formed using these materials.

Through the above process, two kinds of thin film transistors, the channel-etched thin film transistor 450 and the bottom-contact thin film transistor 460, can be manufactured over the same substrate.

In the channel-etched thin film transistor 450, the channel length L of the channel formation region is as short as a length greater than or equal to 0.1 μm and less than or equal to 2 μm, whereby a thin film transistor having high operation speed is realized. In the bottom-contact thin film transistor 460, the channel length is longer than that of the channel-etched thin film transistor 450, whereby a thin film transistor with a reduced off-state current is realized. Further, the bottom-contact thin film transistor 460 is structured by materials having light-transmitting properties except for the connection electrode layer 452.

In the case where a light-emitting device is manufactured, a plurality of thin film transistors is provided in one pixel. For example, a driver TFT which is electrically connected to a light-emitting element has a channel length L of 55 μm and a channel width W of 20 μm, and a selection TFT which is electrically connected to the gate electrode layer of the driver TFT has a channel length L of 25 μm and a channel width W of 60 μm. The width of a portion of the source electrode layer which overlaps with the gate electrode layer in the channel length direction is 5 μm, and the width of a portion of the drain electrode layer which overlaps with the gate electrode layer in the channel length direction is 5 μm. The structure of the bottom-contact thin film transistor 460 is used for the driver TFT and a selection TFT.

Further, in the case where a light-emitting device is manufactured, a power source supply line which is electrically connected to the source electrode layer of the driver TFT is provided. The power source supply line intersects with a gate wiring and is formed using the same material by the same step as the connection electrode layer 429 formed using a metal conductive film; alternatively, the power source supply line intersects with a source wiring and is formed using the same material by the same step as the gate electrode layer 421b.

Further, in the case where a light-emitting device is manufactured, one electrode of the light-emitting element is electrically connected to the drain electrode layer of the driver TFT, and a common potential line which is electrically connected to the other electrode of the light-emitting element is provided. The common potential line is formed using the same material by the same step as the connection electrode layer 429 formed using a metal conductive film; alternatively, the common potential line is formed using the same material by the same step as the gate electrode layer 421b.

Further, in the case where a light-emitting device is manufactured, a plurality of thin film transistors is provided in one pixel, and a connection portion which connects the gate electrode layer of one thin film transistor to the drain electrode layer of the other thin film transistor is provided. This connection portion is formed by the same step as the connection electrode layer 429 which is electrically connected to the gate electrode layer 421b.

Further, in the case where a driver circuit is formed over the same substrate, the channel-etched thin film transistor 450 is used and the channel length L is 2 μm and the channel width W is 50 μm, for example. The width of a portion of the source electrode layer which overlaps with the gate electrode layer in the channel length direction is 2 μm, and the width of a portion of the drain electrode layer which overlaps with the gate electrode layer in the channel length direction is 2 μm.

A plurality of kinds of circuits, a driver circuit and a pixel portion in this embodiment, is formed over the same substrate, and either of the channel-etched thin film transistor 450 or the bottom-contact thin film transistor 460 is used in accordance with respective characteristics of the driver circuit and the pixel portion, thereby achieving optimization.

Embodiment 2

In this embodiment, an example is described in which an active matrix light-emitting display device is manufactured using a plurality of thin film transistors described in Embodiment 1 and a light-emitting element utilizing electroluminescence.

Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Based on this mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 2:
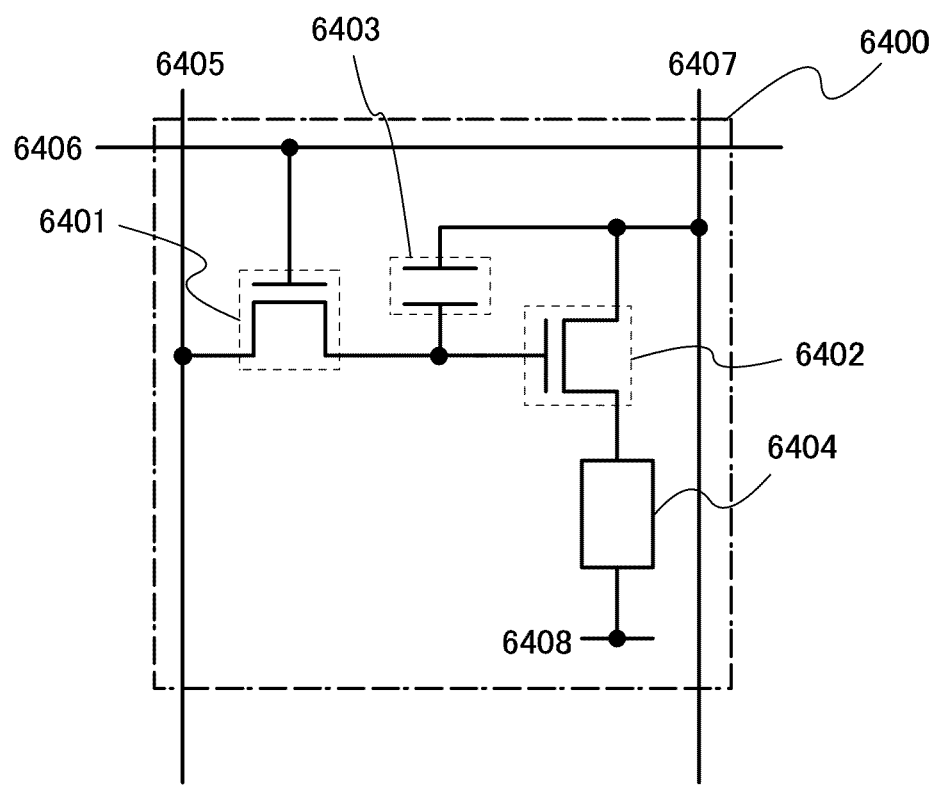
FIG. 2 is a circuit diagram according to one embodiment of the present invention.

FIG. 2 illustrates an example of a pixel structure to which digital time grayscale driving can be applied, as an example of a semiconductor device.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is an electric potential satisfying the low power supply potential<a high power supply potential with reference to the high power supply potential that is set to the power supply line 6407. As the low power supply potential, a GND potential, 0 V, or the like may be employed, for example. An electric potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each electric potential is set so that the electric potential difference between the high power supply potential and the low power supply potential is forward threshold voltage or higher of the light-emitting element 6404.

Gate capacitance of the driver transistor 6402 may be used as a substitute for the capacitor 6403, so that the capacitor 6403 can be omitted. The gate capacitance of the driver transistor 6402 may be formed between a channel region and a gate electrode.

In the case of a voltage-input voltage driving method, a video signal is input to the gate of the driver transistor 6402 so that the driver transistor 6402 is in either of two states of being sufficiently turned on and turned off. That is, the driver transistor 6402 operates in a linear region. Since the driver transistor 6402 operates in a linear region, voltage higher than the voltage of the power supply line 6407 is applied to the gate of the driver transistor 6402. Note that voltage higher than or equal to (voltage of the power supply line+$V_{th}$ of the driver transistor 6402) is applied to the signal line 6405.

In the case of performing analog grayscale driving instead of digital time grayscale driving, the same pixel structure as that in FIG. 2 can be used by changing signal input.

In the case of performing analog grayscale driving, voltage higher than or equal to (forward voltage of the light-emitting element 6404+$V_{th}$ of the driver transistor 6402) is applied to the gate of the driver transistor 6402. The forward voltage of the light-emitting element 6404 indicates voltage at which a desired luminance is obtained, and includes at least forward threshold voltage. By inputting a video signal to enable the driver transistor 6402 to operate in a saturation region, current can be supplied to the light-emitting element 6404. In order to allow the driver transistor 6402 to operate in the saturation region, the electric potential of the power supply line 6407 is higher than a gate electric potential of the driver transistor 6402. When an analog video signal is used, it is possible to feed current to the light-emitting element 6404 in accordance with the video signal and perform analog grayscale driving.

Note that an embodiment of the present invention is not limited to the pixel structure illustrated in FIG. 2. For example, a switch, a resistor, a capacitor, a transistor, a logic circuit, or the like may be added to the pixel illustrated in FIG. 2.

Next, structures of the light-emitting element are described with reference to FIGS. 3A to 3C. A cross-sectional structure of a pixel is described by taking an n-channel driver TFT as an example. Driver TFTs 7001, 7011, and 7021, which are used in semiconductor devices illustrated in FIGS. 3A, 3B, and 3C, respectively, can be formed in a manner similar to that of the thin film transistor which is described in Embodiment 1 and are highly reliable thin film transistors each including an oxide semiconductor layer.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a bottom emission structure is described with reference to FIG. 3A.

FIG. 3A is a cross-sectional view of a pixel in the case where the driver TFT 7011 is an n-channel transistor and light is emitted from a light-emitting element 7012 to a first electrode 7013 side. In FIG. 3A, the first electrode 7013 of the light-emitting element 7012 is formed over a light-transmitting conductive film 7017 that is electrically connected to the driver TFT 7011 via a connection electrode layer 7030, and an EL layer 7014 and a second electrode 7015 are stacked in that order over the first electrode 7013. Note that the connection electrode layer 7030 is electrically connected to the drain electrode layer of the driver TFT 7011 through a contact hole formed in the oxide insulating layer 7031.

As the light-transmitting conductive film 7017, a light-transmitting conductive film of a material such as an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, an indium tin oxide to which a silicon oxide is added, or the like can be used.

Any of a variety of materials can be used for the first electrode 7013 of the light-emitting element. For example, in the case of using the first electrode 7013 as a cathode, the first electrode 7013 is preferably formed using a material having a low work function examples of which are an alkali metal such as Li or Cs; an alkaline earth metal such as Mg, Ca, or Sr; an alloy containing any of these metals (e.g., Mg:Ag or Al:Li); and a rare earth metal such as Yb or Er. In FIG. 3A, the first electrode 7013 is formed to have a thickness through which light can be transmitted (preferably, approximately 5 nm to 30 nm). For example, an aluminum film with a thickness of 20 nm can be used as the first electrode 7013.

Alternatively, a light-transmitting conductive film and an aluminum film may be stacked and then selectively etched so as to form the light-transmitting conductive film 7017 and the first electrode 7013. In this case, the etching can be performed using the same mask, which is preferable.

Further, the peripheral portion of the first electrode 7013 is covered with a partition 7019. The partition 7019 is formed using an organic resin film of polyimide, an acrylic resin, polyamide, an epoxy resin, or the like, an inorganic insulating film, or organic polysiloxane. It is particularly preferable that the partition 7019 be formed using a photosensitive resin material to have an opening portion over the first electrode 7013 so that a sidewall of the opening portion is formed as a tilted surface with continuous curvature. When the partition 7019 is formed using a photosensitive resin material, a step of forming a resist mask can be omitted.

The EL layer 7014 which is formed over the first electrode 7013 and the partition 7019 includes at least the light-emitting layer and may be formed using a single layer or a plurality of layers stacked. When the EL layer 7014 is formed using a plurality of layers, the EL layer 7014 is formed by stacking an electron-injection layer, an electron-transport layer, a light-emitting layer, a hole-transport layer, and a hole-injection layer in that order over the first electrode 7013 which functions as a cathode. Note that it is not necessary to form all of these layers.

In addition, the present invention is not limited to the above order of the stacked layers; that is, the first electrode 7013 may function as an anode and the EL layer 7014 may be formed by stacking a hole-injection layer, a hole-transport layer, a light-emitting layer, an electron-transport layer, and an electron-injection layer in that order over the first electrode 7013. Note that when power consumption is contrasted, it is more preferable that an electron-injection layer, an electron-transport layer, a light-emitting layer, a hole-transport layer, and a hole-injection layer are stacked in that order over the first electrode 7013 which functions as a cathode because an increase in voltage in the driver circuit portion can be suppressed and power consumption can be reduced.

Any of a variety of materials can be used for the second electrode 7015 which is formed over the EL layer 7014. For example, in the case of using the second electrode 7015 as an anode, a material having a high work function, examples of which are ZrN, Ti, W, Ni, Pt, Cr, and a transparent conductive material such as ITO, IZO, and ZnO, is preferable. Further, over the second electrode 7015, a light-blocking film 7016 is formed using, for example, a metal which blocks light or a metal which reflects light. In this embodiment, an ITO film is used as the second electrode 7015 and a Ti film is used as the light-blocking film 7016.

The light-emitting element 7012 corresponds to a region where the EL layer 7014 including the light-emitting layer is sandwiched between the first electrode 7013 and the second electrode 7015. In the case of the element structure illustrated in FIG. 3A, light is emitted from the light-emitting element 7012 to the first electrode 7013 side as indicated by an arrow.

Note that in FIG. 3A, an example in which a light-transmitting conductive film is used as the gate electrode layer. Light emitted from the light-emitting element 7012 passes through the color filter layer 7033 and then passes through the gate electrode layer, the source electrode layer, and the like of the TFT 7011 so as to be emitted to the outside. By using a light-transmitting conductive film as the gate electrode layer, the source electrode layer, or the like of the TFT 7011, an increased aperture ratio can be obtained.

The color filter layer 7033 is formed by: a droplet discharge method such as an ink-jet method; a printing method; an etching method using a photolithography technique; or the like.

The color filter layer 7033 is covered with an overcoat layer 7034 and the protective insulating layer 7035 is further formed thereover. Note that although the overcoat layer 7034 is illustrated to have a small thickness in FIG. 3A, the overcoat layer 7034 has a function of reducing unevenness caused by the color filter layer 7033.

The contact hole formed in the protective insulating layer 7035 and the insulating layer 7032 and reaching the connection electrode layer 7030 is in a position which overlaps with the partition 7019. Since a metal conductive film is used as the connection electrode layer 7030 in the example illustrated in FIG. 3A, an increased aperture ratio can be obtained by employing a structure in which the contact hole reaching the connection electrode layer 7030, the partition 7019, and the connection electrode layer 7030 overlap with one another.

A light-emitting element having a dual emission structure is described with reference to FIG. 3B.

In FIG. 3B, a first electrode 7023 of the light-emitting element 7022 is formed over a light-transmitting conductive film 7027 that is electrically connected to the driver TFT 7021 via a connection electrode layer 7040, and an EL layer 7024 and a second electrode 7025 are stacked in that order over the first electrode 7023. Note that the connection electrode layer 7040 is electrically connected to the drain electrode layer of the driver TFT 7021 through a contact hole formed in an oxide insulating layer 7041.

The light-transmitting conductive film 7027 can be formed using a light-transmitting conductive film of a material such as an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, an indium tin oxide to which a silicon oxide is added, or the like.

Any of a variety of materials can be used for the first electrode 7023. For example, in the case of using the first electrode 7023 as a cathode, the first electrode 7023 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er. In this embodiment, the first electrode 7023 is used as a cathode and is formed to have a thickness through which light can be transmitted (preferably, approximately 5 nm to 30 nm). For example, an aluminum film with a thickness of 20 nm can be used as the cathode.

Alternatively, a light-transmitting conductive film and an aluminum film may be stacked and then selectively etched so as to form the light-transmitting conductive film 7027 and the first electrode 7023. In this case, the etching can be performed using the same mask, which is preferable.

Further, the peripheral portion of the first electrode 7023 is covered with a partition 7029. The partition 7029 is formed using an organic resin film of polyimide, an acrylic resin, polyamide, an epoxy resin, or the like, an inorganic insulating film, or organic polysiloxane. It is particularly preferable that the partition 7029 be formed using a photosensitive resin material to have an opening portion over the first electrode 7023 so that a sidewall of the opening portion is formed as a tilted surface with continuous curvature. When the partition 7029 is formed using a photosensitive resin material, a step of forming a resist mask can be omitted.

The EL layer 7024 which is formed over the first electrode 7023 and the partition 7029 includes at least the light-emitting layer and may be formed using a single layer or a plurality of layers stacked. When the EL layer 7024 is formed using a plurality of layers, the EL layer 7024 is formed by stacking an electron-injection layer, an electron-transport layer, a light-emitting layer, a hole-transport layer, and a hole-injection layer in that order over the first electrode 7023 which functions as a cathode. Note that it is not necessary to form all of these layers.

In addition, the present invention is not limited to the above order of the stacked layers; that is, the first electrode 7023 may be used as an anode and the EL layer 7024 may be formed by stacking a hole-injection layer, a hole-transport layer, a light-emitting layer, an electron-transport layer, and an electron-injection layer in that order over the anode. Note that when power consumption is contrasted, it is more preferable that an electron-injection layer, an electron-transport layer, a light-emitting layer, a hole-transport layer, and a hole-injection layer are stacked in that order over the first electrode 7023 which functions as a cathode because power consumption can be suppressed.

Any of a variety of materials can be used for the second electrode 7025 which is formed over the EL layer 7024. For example, in the case of using the second electrode 7025 as an anode, a material having a high work function, examples of which include a transparent conductive material such as ITO, IZO, and ZnO, is preferably used. In this embodiment, the second electrode 7025 is used as an anode and an ITO film containing a silicon oxide is formed as the second electrode 7025.

The light-emitting element 7022 corresponds to a region where the EL layer 7024 including the light-emitting layer is sandwiched between the first electrode 7023 and the second electrode 7025. In the case of the element structure illustrated in FIG. 3B, light is emitted from the light-emitting element 7022 to both the second electrode 7025 side and the first electrode 7023 side as indicated by arrows.

Note that in FIG. 3B, an example in which a light-transmitting conductive film is used as the gate electrode layer. Light emitted from the light-emitting element 7022 to the first electrode 7023 side passes through a color filter layer 7043 and then passes through the gate electrode layer, the source electrode layer, and the like of the TFT 7021 so as to be emitted to the outside. By using a light-transmitting conductive film as the gate electrode layer, the source electrode layer, or the like of the TFT 7021, an aperture ratio on the second electrode 7025 side can be substantially the same as that on the first electrode 7023 side.

The color filter layer 7043 is formed by: a droplet discharge method such as an ink-jet method; a printing method; an etching method using a photolithography technique; or the like.

The color filter layer 7043 is covered with an overcoat layer 7044 and the protective insulating layer 7045 is further formed thereover.

A contact hole formed in an insulating layer 7042 and a protective insulating layer 7045 and reaching the connection electrode layer 7040 is in a position which overlaps with the partition 7029. Since a metal conductive film is used as the connection electrode layer 7040 in the example illustrated in FIG. 3B, an aperture ratio on the second electrode 7025 side can be substantially the same as that on the first electrode 7023 side by employing a structure in which the contact hole reaching the connection electrode layer 7040, the partition 7029 and the connection electrode layer 7040 overlap with one another.

Note that in the case where full-color display is realized on both display surfaces by using a light-emitting element having a dual emission structure, light emitted from the second electrode 7025 side does not pass through the color filter layer 7043; therefore, it is preferable that a sealing substrate having a color filter layer be further provided over the second electrode 7025.

A light-emitting element having a top emission structure is described with reference to FIG. 3C.

FIG. 3C is a cross-sectional view of a pixel in the case where the TFT 7001 which is a driver TFT is of an n-type and light is emitted from a light-emitting element 7002 to a second electrode 7005 side. In FIG. 3C, a first electrode 7003 of the light-emitting element 7002 is electrically connected to the driver TFT 7001 via a connection electrode layer 7050, and an EL layer 7004 and the second electrode 7005 are stacked in that order over the first electrode 7003.

Any of a variety of materials can be used for the first electrode 7003. For example, in the case of using the first electrode 7003 as a cathode, the first electrode 7003 is preferably formed using a material having a low work function such as an alkali metal such as Li or Cs; an alkaline earth metal such as Mg, Ca, or Sr; an alloy containing any of these metals (e.g., Mg:Ag or Al:Li); or a rare earth metal such as Yb or Er.

Further, the peripheral portion of the first electrode 7003 is covered with a partition 7009. The partition 7009 is formed using an organic resin film of polyimide, an acrylic resin, polyamide, an epoxy resin, or the like, an inorganic insulating film, or organic polysiloxane. It is particularly preferable that the partition 7009 be formed using a photosensitive resin material to have an opening portion over the first electrode 7003 so that a sidewall of the opening portion is formed as a tilted surface with continuous curvature. When the partition 7009 is formed using a photosensitive resin material, a step of forming a resist mask can be omitted.

The EL layer 7004 which is formed over the first electrode 7003 and the partition 7009 includes at least the light-emitting layer and may be formed using a single layer or a plurality of layers stacked. When the EL layer 7004 is formed using a plurality of layers, the EL layer 7004 is formed by stacking an electron-injection layer, an electron-transport layer, a light-emitting layer, a hole-transport layer, and a hole-injection layer in that order over the first electrode 7003 which functions as a cathode. Note that it is not necessary to form all of these layers.

In addition, the present invention is not limited to the above order of the stacked layers; that is, the EL layer 7004 may be formed by stacking a hole-injection layer, a hole-transport layer, a light-emitting layer, an electron-transport layer, and an electron-injection layer in that order over the first electrode 7003 which is used as an anode.

In FIG. 3C, over a stacked-layer film in which a Ti film, an aluminum film, a Ti film are stacked in that order, a hole-injection layer, a hole-transport layer, a light-emitting layer, an electron-transport layer, and an electron-injection layer are stacked in that order. Further, an alloy thin film of Mg:Ag and an ITO film are stacked thereover.

Note that when the TFT 7001 is an n-type TFT, it is more preferable that an electron-injection layer, an electron-transport layer, a light-emitting layer, a hole-transport layer, and a hole-injection layer are stacked in that order over the first electrode 7003 because an increase in voltage in the driver circuit portion can be suppressed and power consumption can be reduced.

The second electrode 7005 is formed using a light-transmitting conductive material; for example, an indium oxide containing a tungsten oxide, an indium zinc oxide containing a tungsten oxide, an indium oxide containing a titanium oxide, an indium tin oxide containing a titanium oxide, an indium tin oxide, an indium zinc oxide, an indium tin oxide to which a silicon oxide is added, or the like may be used.

The light-emitting element 7002 corresponds to a region where the EL layer 7004 including the light-emitting layer is sandwiched between the first electrode 7003 and the second electrode 7005. In the case of the element structure illustrated in FIG. 3C, light is emitted from the light-emitting element 7002 to the second electrode 7005 side as indicated by an arrow.

Although an example in which the thin film transistor 460 is used as the TFT 7001 is illustrated in FIG. 3C, the present invention is not particularly limited thereto and, the thin film transistor 450 can be alternatively used. When the thin film transistor 450 is used as the TFT 7001, the first electrode 7003 is made to be electrically connected to a drain electrode layer of the TFT 7001.

In FIG. 3C, the drain electrode layer of the TFT 7001 is electrically connected to the connection electrode layer 7050 through a contact hole formed in the oxide insulating layer 7051. The connection electrode layer 7050 is electrically connected to the first electrode 7003 through a contact hole formed in a protective insulating layer 7052 and an insulating layer 7055. A planarizing insulating layer 7053 can be formed using a resin material such as polyimide, an acrylic resin, a benzocyclobutene resin, polyamide, or an epoxy resin. Other than such resin materials, it is also possible to use a low-dielectric constant material (a low-k material), a siloxane-based resin, PSG (phosphosilicate glass), BPSG (borophosphosilicate glass), or the like. Note that the planarizing insulating layer 7053 may be formed by stacking a plurality of insulating films formed using these materials. There is no particular limitation on the method for forming the planarizing insulating layer 7053, and the planarizing insulating layer 7053 can be formed, depending on the material, by a method such as a sputtering method, an SOG method, spin coating, dipping, spray coating, or a droplet discharge method (e.g., an ink-jet method, screen printing, or offset printing), or with a tool (equipment) such as a doctor knife, a roll coater, a curtain coater, or a knife coater.

The partition 7009 is provided in order to insulate the first electrode 7003 from a first electrode of an adjacent pixel.

In the structure illustrated in FIG. 3C, for performing full-color display, the light-emitting element 7002, one of adjacent light-emitting elements, and the other of the adjacent light-emitting elements are, for example, a green emissive light-emitting element, a red emissive light-emitting element, and a blue emissive light-emitting element, respectively. Alternatively, a light-emitting display device capable of full-color display may be manufactured using four kinds of light-emitting element, which include white emissive light-emitting elements as well as three kinds of light-emitting elements.

In the structure illustrated in FIG. 3C, a light-emitting display device capable of full-color display may be manufactured in the following manner: all the light-emitting elements to be arranged are white emissive light-emitting elements; and a sealing substrate having a color filter is placed over the light-emitting element 7002. When a material which exhibits monochromatic light such as white light is formed and combined with color filters or color conversion layers, full-color display can be performed.

Needless to say, display of monochromatic light emission can also be performed. For example, a lighting device may be formed utilizing white light emission; alternatively, an area-color light-emitting device using monochromatic light emission may be formed.

Moreover, an optical film such as a polarizing film, one of examples of which is a circular polarizing plate, may be provided when needed.

Although the organic EL elements are described here as the light-emitting elements, an inorganic EL element can also be provided as a light-emitting element.

Note that the example is described in which a thin film transistor (a driver TFT) which controls the driving of a light-emitting element is electrically connected to the light-emitting element; however, a structure may be employed in which a TFT for current control is connected between the driver TFT and the light-emitting element.

Embodiment 3

In this embodiment, an example in which a pixel portion and a driver circuit are formed over the same substrate by using the plurality of thin film transistors described in Embodiment 1 to manufacture an active matrix light-emitting display device is described.

In this embodiment, not only a cross section of two thin film transistors and a connection portion which is illustrated in Embodiment 1 but also a wiring intersection portion and a capacitor are illustrated for description.

Figure 4:
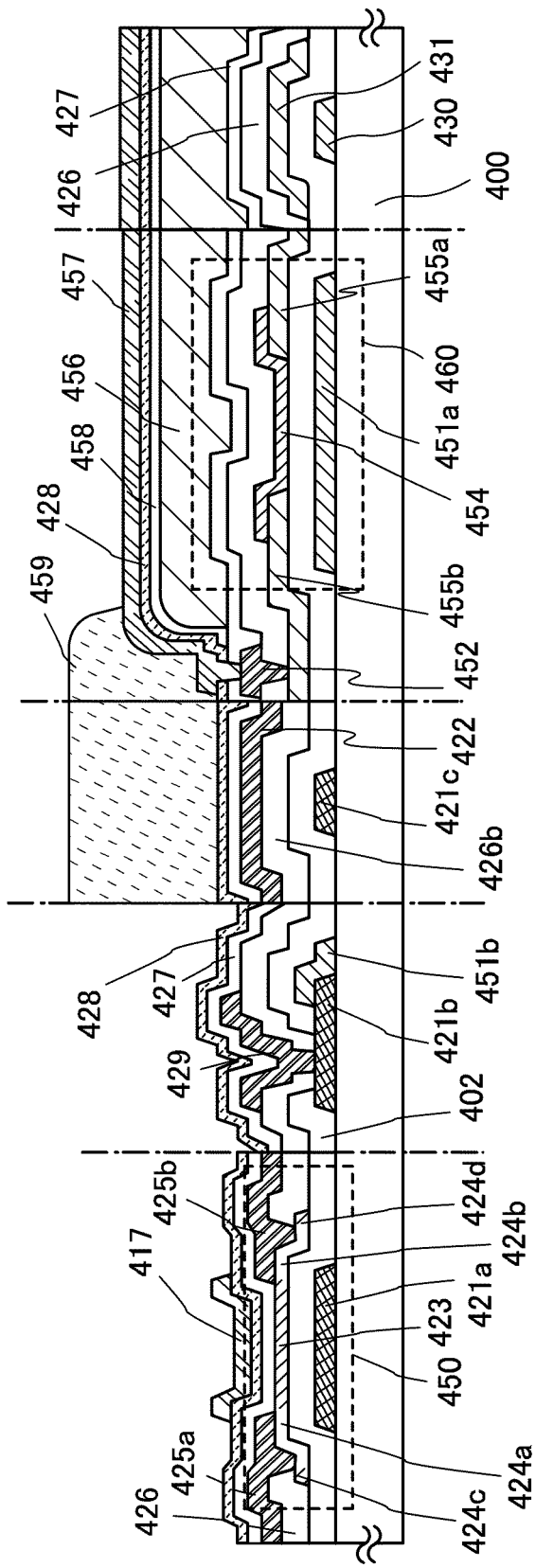
FIG. 4 is a cross-sectional view illustrating one embodiment of the present invention.

FIG. 4 is a cross-sectional view of a state of a substrate before an EL layer is formed over a first electrode (a pixel electrode). In FIG. 4, portions common to FIG. 1D are denoted by the same reference numerals.

In FIG. 4, a driver TFT which is electrically connected to a first electrode 457 is a bottom-contact thin film transistor 460, which can be manufactured in accordance with Embodiment 1 in this embodiment.

After an insulating layer 427 is formed in accordance with Embodiment 1, a green color filter layer 456, a blue color filter layer, and a red color filter layer are formed. Each color filter layer is formed by a printing method, an ink-jet method, an etching method using a photolithography technique, or the like. By providing the color filter layer, alignment of the color filter layer and a light-emitting region of a light-emitting element can be performed without depending on the alignment accuracy of the sealing substrate.

Next, an overcoat layer 458 which covers the green color filter layer 456, the blue color filter layer, and the red color filter layer is formed. The overcoat layer 458 is formed using a light-transmitting resin.

An example in which full color display is performed using three colors of RGB is described in this embodiment; however, the present invention is not particularly limited thereto, and full color display device may be performed using four colors of RGBW.

Next, a protective insulating layer 428 covering the overcoat layer 458 and the insulating layer 427 is formed. The protective insulating layer 428 is formed using an inorganic insulating film such as a silicon nitride film, an aluminum nitride film, a silicon nitride oxide film, or an aluminum oxynitride film. It is preferable that the protective insulating layer 428 be an insulating film having the same component as the insulating layer 427 because they can be etched by one step when a contact hole is formed. In this embodiment, a silicon nitride film is formed as the protective insulating layer 428 by an RF sputtering method.

Next, the protective insulating layer 428 and the insulating layer 427 are selectively etched by a photolithography step, so that a contact hole reaching the connection electrode layer 452 is formed. In addition, by this photolithography step, the protective insulating layer 428 and the insulating layer 427 in a terminal portion are selectively etched to expose part of a terminal electrode. Further, in order to connect a second electrode of a light-emitting element formed later to a common potential line, a contact hole reaching the common potential line is also formed.

Next, a light-transmitting conductive film is formed and a photolithography step is performed, so that the first electrode 457 which is electrically connected to the connection electrode layer 452 is formed.

Next, a partition 459 is formed to cover the peripheral portion of the first electrode 457. The partition 459 is formed using an organic resin film of polyimide, an acrylic resin, polyamide, an epoxy resin, or the like, an inorganic insulating film, or organic polysiloxane. Particularly, the partition 459 is formed using a photosensitive resin material to have an opening portion over the first electrode 457 so that a sidewall of the opening portion is formed as a tilted surface with continuous curvature. When the partition 459 is formed using a photosensitive resin material, a step of forming a resist mask can be omitted.

Through the above process, the state of the substrate illustrated in FIG. 4 can be obtained. After the above process, as described in Embodiment 2 as an example, an EL layer is formed over the first electrode 457, and a second electrode is formed over the EL layer, thereby forming a light-emitting element. The second electrode is electrically connected to the common potential line.

In the pixel portion, a capacitor is formed as illustrated in FIG. 4. The capacitor illustrated in FIG. 4 is formed using a gate insulating layer 402 as a dielectric, a capacitor wiring layer 430, and a capacitor electrode layer 431. In a light-emitting device, the capacitor wiring layer 430 is part of a power supply line, and the capacitor electrode layer 431 is part of a gate electrode layer of a driver TFT.

Further, in the wiring intersection portion, in order to reduce the parasitic capacitance, the gate insulating layer 402 and an oxide insulating layer 426b are sacked between a gate wiring layer 421c and a source wiring layer 422 as illustrated in FIG. 4. Although the example in which the gate wiring layer 421c is a metal conductive film is illustrated in FIG. 4, a light-transmitting conductive film which is the same as a gate electrode layer 451a of the thin film transistor 460 may be alternatively used as well.

In FIG. 4, at least one TFT provided in the driver circuit is the thin film transistor 450 which is a channel-etched thin film transistor, which can be manufactured in accordance with Embodiment 1 in this embodiment.

A conductive layer 417 may be provided over an oxide semiconductor layer of the thin film transistor 450 of the driver circuit. The conductive layer 417 can be formed using the same material by the same step as the first electrode 457. This conductive layer 417 serves as a back gate of the thin film transistor 450.

In addition, by providing the conductive layer 417 so as to overlap with the channel formation region 423 of the oxide semiconductor layer, in a bias-temperature stress test (hereinafter, referred to as a BT test) for examining reliability of a thin film transistor, the amount of change in the threshold voltage of the thin film transistor 450 between before and after the BT test can be reduced. The conductive layer 417 may have the same electric potential as the gate electrode layer 421a or have an electric potential different from that of the gate electrode layer 421a, and can function as a second gate electrode layer. Alternatively, the electric potential of the conductive layer 417 may be a GND potential, 0 V, or the conductive layer 417 may be in a floating state.

Since a thin film transistor is easily broken due to static electricity or the like, it is preferable to provide a protective circuit over the same substrate as the pixel portion or the driver circuit. The protective circuit is preferably formed with a non-linear element including an oxide semiconductor layer. For example, protective circuits are provided between the pixel portion and a scan line input terminal and between the pixel portion and a signal line input terminal In this embodiment, a plurality of protective circuits is provided so as to prevent breakage of a pixel transistor and the like which can be caused when surge voltage due to static electricity or the like is applied to a scan line, a signal line, or a capacitor bus line. Therefore, the protective circuit is formed so as to release charge to a common wiring when surge voltage is applied to the protective circuit. Further, the protective circuit includes non-linear elements arranged in parallel to the scan line. The non-linear element includes a two-terminal element such as a diode or a three-terminal element such as a transistor. For example, the non-linear element can be formed through the same process as the thin film transistor 460 provided in the pixel portion, and can be made to have the same properties as a diode by connecting a gate terminal to a drain terminal of the non-linear element.

This embodiment can be combined with Embodiment 1 or 2.

Embodiment 4

In this embodiment, an example of the structure of a terminal portion provided over the same substrate as a thin film transistor is illustrated in FIGS. 5A1 to 5B2. Note that in FIGS. 5A1 to 5B2, portions common to FIG. 4 are denoted by the same reference numerals as FIG. 4.

FIGS. 5A1 and 5A2 are a cross-sectional view and a plan view of a gate wiring terminal portion, respectively. FIG. 5A1 is a cross-sectional view taken along line C1-C2 in FIG. 5A2. In FIG. 5A1, a conductive layer 415 formed over a stacked layer of the insulating layer 427 and the protective insulating layer 428 is a connection terminal electrode which functions as an input terminal. In the terminal portion in FIG. 5A1, a first terminal 411 formed using the same material as the gate wiring layer 421*c* and a connection electrode layer 412 formed using the same material as the source wiring layer 422 overlap with each other with the gate insulating layer 402 interposed therebetween, and are electrically connected to each other via the conductive layer 415. Further, the conductive layer 415 can be formed using the same material having a light-transmitting property by the same step as the first electrode 457.

FIGS. 5B1 and 5B2 are a cross-sectional view and a plan view of a source wiring terminal portion, respectively. FIG. 5B1 is a cross-sectional view taken along line C3-C4 in FIG. 5B2. In FIG. 5B1, a conductive layer 418 formed over a stacked layer of the insulating layer 427 and the protective insulating layer 428 is a connection terminal electrode which functions as an input terminal Further, in the terminal portion in FIG. 5B1, an electrode layer 416 formed using the same material as the gate wiring layer 421*c* is located below and overlaps with a second terminal 414 which is electrically connected to a source wiring, with the gate insulating layer 402 interposed therebetween. The electrode layer 416 is not electrically connected to the second terminal 414, and a capacitance as a countermeasure against noise or static electricity can be formed when the electric potential of the electrode layer 416 is set to an electric potential different from that of the second terminal 414, such as floating, a GND potential, 0 V, or the like. Further, the second terminal 414 is electrically connected to the conductive layer 418 through a contact hole formed in the insulating layer 427 and the protective insulating layer 428. The conductive layer 418 can be formed using the same material having a light-transmitting property by the same step as the first electrode 457.

A plurality of gate wirings, source wirings, common potential lines, and power supply lines are provided depending on the pixel density. In the terminal portion, the first terminal at the same electric potential as the gate wiring, the second terminal at the same electric potential as the source wiring, a third terminal at the same electric potential as the power supply line, and a fourth terminal at the same electric potential as the common potential line, and the like are provided. The number of each of the terminals may be any number, and the number of the terminals may be determined by a practitioner as appropriate.

This embodiment can be freely combined with Embodiment 1, 2, or 3.

Embodiment 5

In this embodiment, examples of an element structure which is applied to any of the light-emitting elements described in Embodiment 2 with reference to FIGS. 3A and 3C are described.

Figure 6A:
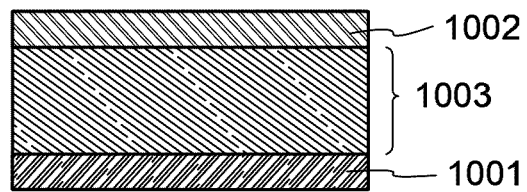
FIGS. 6A and 6B are cross-sectional views illustrating one embodiment of the present invention.

In an element structure illustrated in FIG. 6A, an EL layer 1003 including a light-emitting region is sandwiched between a pair of electrodes (a first electrode 1001 and a second electrode 1002). Note that the first electrode 1001 is used as an anode and the second electrode 1002 is used as a cathode as an example in the following description of Embodiment 5.

The EL layer 1003 includes at least a light-emitting layer, and may also have a stacked-layer structure including a functional layer other than the light-emitting layer. Examples of the functional layer other than the light-emitting layer include a layer containing a substance having a high hole-injection property, a substance having a high hole-transport property, a substance having a high electron-transport property, a substance having a high electron-injection property, a bipolar substance (a substance having high electron and hole transport properties), or the like. Specifically, functional layers such as a hole-injection layer, a hole-transport layer, an electron-transport layer, and an electron-injection layer can be used in combination as appropriate.

A light-emitting element illustrated in FIG. 6A emits light when current flows by the electric potential difference generated between the first electrode 1001 and the second electrode 1002, and holes and electrons are recombined in the EL layer 1003. That is, the light-emitting region is formed in the EL layer 1003.

Light emission is extracted outside through one of or both the first electrode 1001 and the second electrode 1002. Accordingly, one of or both the first electrode 1001 and the second electrode 1002 are formed of a light-transmitting substance.

Figure 6B:
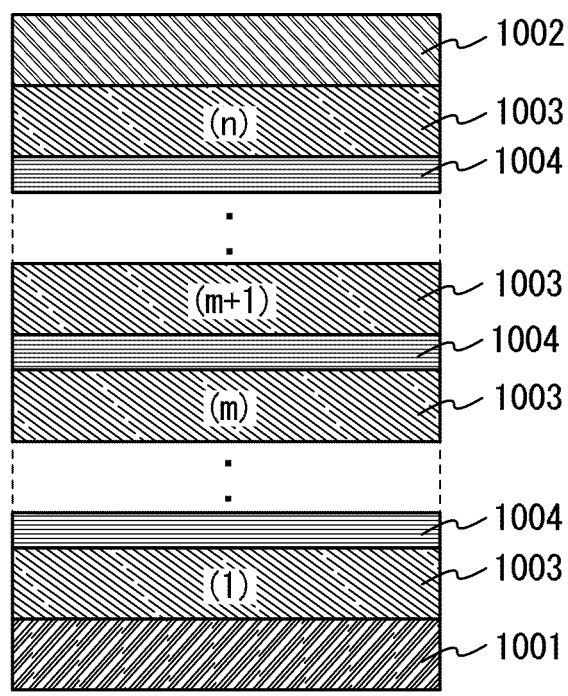

Note that a plurality of EL layers may be formed between the first electrode 1001 and the second electrode 1002 as illustrated in FIG. 6B. In the case where n (n is a natural number of 2 or more) layers are stacked, a charge generation layer 1004 is preferably provided between an m-th EL layer and an (m+1)-th EL layer. Note that m is a natural number, and greater than or equal to 1 and less than or equal to (n−1).

The charge generation layer 1004 may be formed of a composite material of an organic compound and a metal oxide, a metal oxide, or a composite material of an organic compound and an alkali metal, an alkaline earth metal, or a compound thereof; alternatively, these materials may be combined as appropriate. The composite material of an organic compound and a metal oxide includes, for example, an organic compound and a metal oxide such as $V_2O_5$, $MoO_3$, or $WO_3$. As the organic compound, various compounds such as an aromatic amine compound, a carbazole derivative, aromatic hydrocarbon, and a high molecular compound (oligomer, dendrimer, polymer, or the like) can be used. As the organic compound, it is preferable to use the organic compound which has a hole-transport property and has a hole mobility of $10^{-6}$ cm$^2$/Vs or higher. However, other substances than the above described materials may also be used as long as the substances have higher hole-transport property than electron-transport property. These materials used for the charge generation layer 1004 are excellent in carrier-injection property and carrier-transport property, by which a light-emitting element which can be driven with low current and low voltage can be obtained.

Note that the charge generating layer 1004 may be formed using a combination of a composite material of an organic compound and a metal oxide with another material. For example, a layer containing a composite material of an organic compound and a metal oxide may be combined with a layer containing a compound selected from substances with an electron-donation property and a compound with a high electron-transport property. A layer containing a composite material of an organic compound and a metal oxide may be combined with a transparent conductive film.

As for a light-emitting element having such a structure, problems such as energy transfer and quenching are unlikely to occur, and a light-emitting element which has both high light emission efficiency and long lifetime can be easily obtained due to expansion in the choice of materials. Moreover, a light-emitting element which provides phosphorescence from one of the EL layers and fluorescence from the other of the EL layers can be easily obtained.

Note that the charge generation layer 1004 has a function of injecting holes to one EL layer 1003 which is formed in contact with the charge generation layer 1004 and a function of injecting electrons to the other EL layer 1003 which is formed in contact with the charge generation layer 1004, when voltage is applied to the first electrode 1001 and the second electrode 1002.

A light-emitting element illustrated in FIG. 6B can provide a variety of emission colors by changing the type of the light-emitting substance that is used for the light-emitting layer. In addition, a plurality of light-emitting substances of different emission colors are used as the light-emitting substance, whereby light emission having a broad spectrum or white light emission can also be obtained.

In the case of obtaining white light emission using the light-emitting element illustrated in FIG. 6B, as for the combination of a plurality of light-emitting layers, a structure for emitting white light including red light, green light, and blue light may be used. For example, the structure may include a first EL layer containing a blue fluorescent substance as a light-emitting substance and a second EL layer containing red and green phosphorescent substances as light-emitting substances. Alternatively, the structure may include a first EL layer exhibiting red light emission, a second EL layer exhibiting green light emission, and a third EL layer exhibiting blue light emission. Also with a structure including light-emitting layers emitting light of complementary colors, white light emission can be obtained. When light emission from the first EL layer and light emission from the second EL layer have complementary colors to each other in an element including two EL layers stacked, the combination of colors are as follows: blue and yellow, blue-green and red, and the like.

Note that in the structure of the above-mentioned stacked-layer element, by providing the charge generation layer between the stacked EL layers, the element can have long lifetime in a high-luminance region while keeping the current density low. In addition, a voltage drop due to resistance of the electrode material can be reduced, whereby uniform light emission in a large area is possible.

This embodiment can be combined with any one of Embodiments 1 to 4.

Embodiment 6

In Embodiment 6, the appearance and a cross section of a light-emitting display panel (also referred to as a light-emitting panel) are described with reference to FIGS. 7A and 7B. FIG. 7A is a plan view of a panel in which a thin film transistor and a light-emitting element formed over a first substrate are sealed between the first substrate and a second substrate with a sealant. FIG. 7B is a cross-sectional view along line H-I of FIG. 7A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

Further, the pixel portion 4502, the signal line driver circuits 4503a and 4503b, and the scan line driver circuits 4504a and 4504b which are formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 7B.

For the thin film transistors 4509 and 4510, the highly reliable thin film transistor including an oxide semiconductor layer, which is described in Embodiment 1, can be employed. The thin film transistor 450 described in Embodiment 1 and the thin film transistor 460 can be used as the thin film transistors 4509 for a driver circuit and the thin film transistor 4510 for a pixel, respectively. In Embodiment 6, the thin film transistors 4509 and 4510 are n-channel thin film transistors.

Over an insulating layer 4544, a conductive layer 4540 is formed so as to overlap with a channel formation region of an oxide semiconductor layer of the thin film transistors 4509 for a driver circuit. By providing the conductive layer 4540 so as to overlap with the channel formation region of the oxide semiconductor layer, the amount of change in the threshold voltage of the thin film transistor 4509 between before and after the BT test can be reduced. In addition, the conductive layer 4540 may have the same electric potential as the gate electrode layer of the thin film transistor 4509 or have an electric potential different from that of the gate electrode layer of the thin film transistor 4509 and can function as a second gate electrode layer. Alternatively, the electric potential of the conductive layer 4540 may be a GND potential, 0 V, or the conductive layer 4540 may be in a floating state.

In the thin film transistor 4509, an oxide insulating layer 4541 which covers a peripheral portion (including a side surface) of the oxide semiconductor layer is formed.

Further, the thin film transistor 4510 is electrically connected to a first electrode 4517 via a connection electrode layer 4548. Further, an oxide insulating layer 4542 covering the oxide semiconductor layer of the thin film transistor 4510 is formed in the thin film transistor 4510.

The oxide insulating layers 4541 and 4542 each can be formed using a material and a method which are similar to those of the oxide insulating layer 426 described in Embodiment 1. Furthermore, the insulating layer 4544 is formed so as to cover the oxide insulating layers 4541 and 4542. The insulating layer 4544 can be formed using a material and a method which are similar to those of the insulating layer 427 described in the above embodiment.

An a color filter layer 4545 is formed over the thin film transistor 4510 so as to overlap with a light emitting region of a light-emitting element 4511.

Further, in order to reduce the surface roughness of the color filter layer 4545, the color filter layer 4545 is covered with an overcoat layer 4543 functioning as a planarization insulating film.

Further, an insulating layer 4546 is formed over the overcoat layer 4543. The insulating layer 4546 may be formed using a material and a method which are similar to those of the protective insulating layer 428 described in the above embodiment.

Reference numeral 4511 denotes a light-emitting element. The first electrode 4517 which is a pixel electrode included in the light-emitting element 4511 is electrically connected to a source electrode layer or a drain electrode layer of the thin film transistor 4510. Note that the light-emitting element 4511 has a stacked-layer structure of the first electrode 4517, an EL layer 4512, and the second electrode 4513, and there is no particular limitation on the structure. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening portion over the first electrode 4517 so that a sidewall of the opening portion is formed as a tilted surface with continuous curvature.

The EL layer 4512 includes at least the light-emitting layer and may be formed using either a single layer or a plurality of layers stacked.

A protective film may be formed over the second electrode 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and electric potentials are supplied to the signal line driver circuits 4503*a* and 4503*b*, the scan line driver circuits 4504*a* and 4504*b*, or the pixel portion 4502 from FPCs 4518*a* and 4518*b*.

A connection terminal electrode 4515 is formed using the same conductive film as the first electrode 4517 included in the light-emitting element 4511, and a terminal electrode 4516 is formed using the same conductive film as the source and drain electrode layers included in the thin film transistor 4509.

The connection terminal electrode 4515 is electrically connected to a terminal included in the FPC 4518*a* via an anisotropic conductive film 4519.

The substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, as well as an inert gas such as nitrogen or argon. For example, PVC (polyvinyl chloride), an acrylic resin, polyimide, an epoxy resin, a silicone resin, PVB (polyvinyl butyral), or EVA (ethylene vinyl acetate) can be used. For example, nitrogen may be used for the filler.

If needed, an optical film such as a polarizing plate, a circularly polarizing plate (including an elliptically polarizing plate), a retardation plate (a quarter-wave plate or a half-wave plate), or a color filter may be provided as appropriate on a light-emitting surface of the light-emitting element. Further, the polarizing plate or the circularly polarizing plate may be provided with an anti-reflection film. For example, antiglare treatment by which reflected light can be diffused by roughness on the surface so as to reduce the glare can be performed.

The signal line driver circuits 4503*a* and 4503*b* and the scan line driver circuits 4504*a* and 4504*b* may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 7A and 7B.

Through the above process, a highly reliable light-emitting display device (display panel) as a semiconductor device can be manufactured.

Embodiment 7

In this embodiment, an example is described below in which at least part of a driver circuit and a thin film transistor to be provided in a pixel portion are formed over the same substrate.

The thin film transistor provided in the pixel portion is formed according to any of the other embodiments disclosed in this specification. Further, the thin film transistor described in any of the other embodiments disclosed in this specification is an n-channel TFT. Thus, some of driver circuits that can be constituted by n-channel TFTs among the driver circuits are formed over the same substrate as the thin film transistor provided in the pixel portion.

Figure 9A:
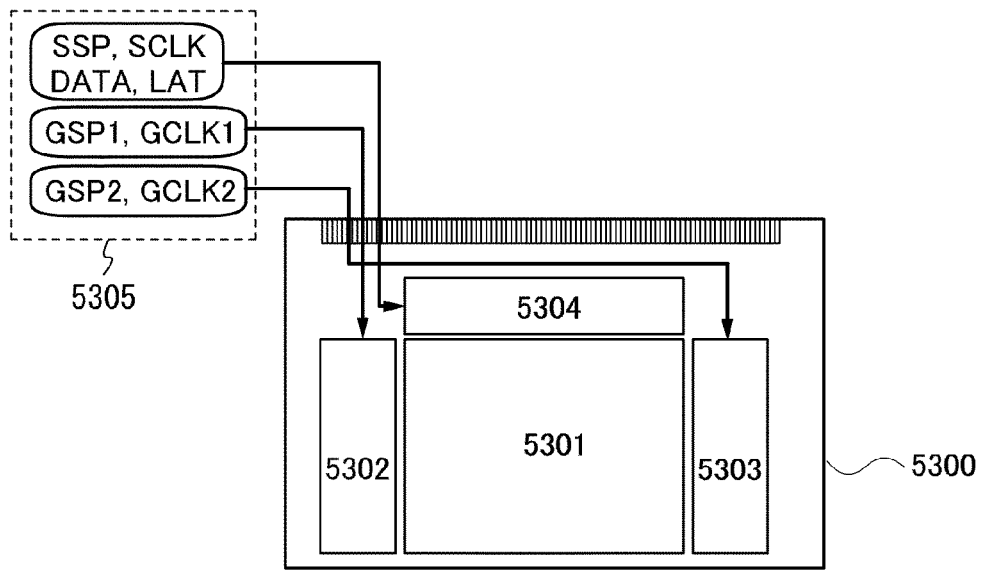
FIGS. 9A and 9B are block diagrams of a display device.

FIG. 9A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extending from the signal line driver circuit 5304 is provided, and a plurality of scan lines extending from the first scan line driver circuit 5302 and the second scan line driver circuit 5303 is provided. Note that in cross regions of the scan lines and the signal lines, pixels each having a display element are arranged in matrix. Further, the substrate 5300 of the display device is connected to a timing control circuit 5305 (also referred to as a controller or a control IC) through a connection portion of a flexible printed circuit (FPC) or the like.

In FIG. 9A, the first scan line driver circuit 5302, the second scan line driver circuit 5303, and the signal line driver circuit 5304 are formed over the same substrate 5300 as the pixel portion 5301. Accordingly, the number of parts such as driver circuits provided outside is reduced, so that cost can be reduced. Moreover, the number of connections in the connection portion in the case where wirings are extended from a driver circuit provided outside the substrate 5300 can be reduced, and the reliability or yield can be improved.

Note that the timing control circuit 5305 supplies a start signal for the first scan line driver circuit (GSP1) and a clock signal for the scan line driver circuit (GCLK1) to the first scan line driver circuit 5302, as an example. In addition, the timing control circuit 5305 supplies, for example, a start signal for the second scan line driver circuit (GSP2) (also referred to as a start pulse) and a clock signal for the scan line driver circuit (GCLK2) to the second scan line driver circuit 5303. A start signal for the signal line driver circuit (SSP), a clock signal for the signal line driver circuit (SCLK), data for a video signal (DATA) (also simply referred to as a video signal), and a latch signal (LAT) are supplied to the signal line driver circuit 5304. Note that each clock signal may be a plurality of clock signals with different phases, or may be supplied with an inverted clock signal (CKB). Note that either the first scan line driver circuit 5302 or the second scan line driver circuit 5303 can be omitted.

Figure 9B:
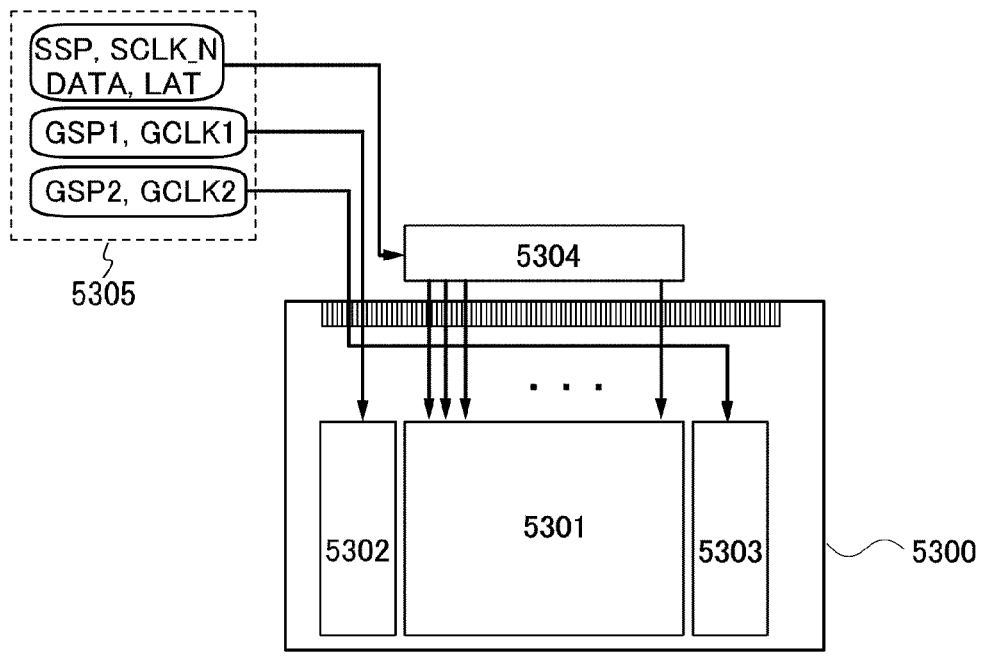

In FIG. 9B, a circuit with a low drive frequency (e.g., the first scan line driver circuit 5302 and the second scan line driver circuit 5303) is formed over the same substrate 5300 as the pixel portion 5301, and the signal line driver circuit 5304 is formed over another substrate which is different from the substrate provided with the pixel portion 5301. This structure enables a driver circuit formed over the substrate 5300 using a thin film transistor having low field effect mobility, compared with a transistor formed using a single crystal semiconductor. Accordingly, an increase in the size of the display device, a reduction in cost, improvement in yield, or the like can be achieved.

Figure 10A:
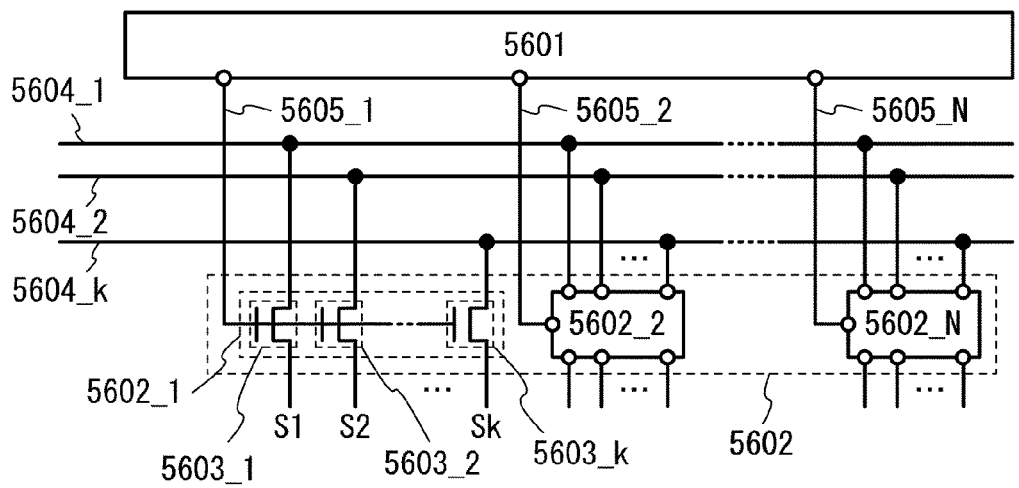
FIGS. 10A and 10B are diagrams illustrating a structure of a signal line driver circuit.
Figure 10B:
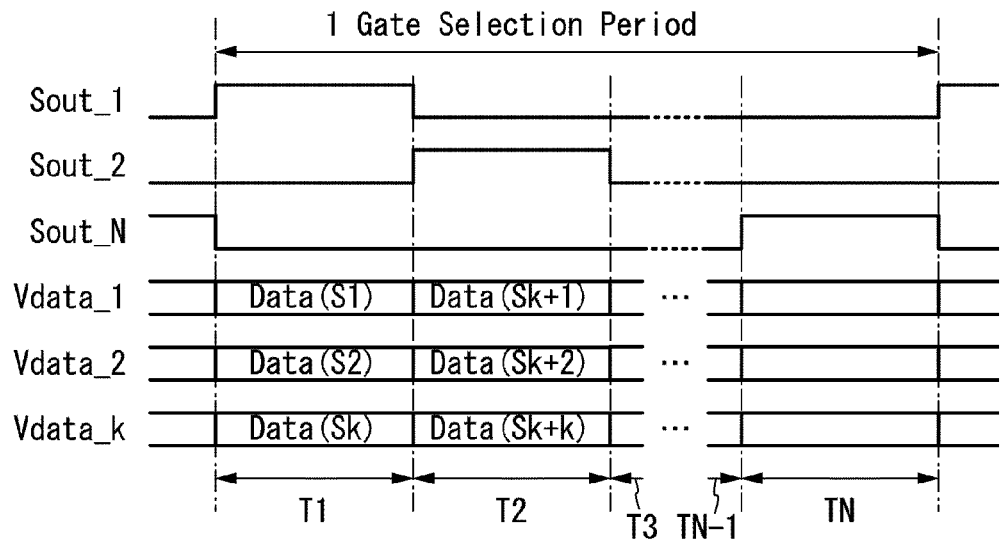

The thin film transistor described in Embodiment 1 is an n-channel TFT. In FIGS. 10A and 10B, an example of a structure and operation of a signal line driver circuit formed using an n-channel TFT is described.

The signal line driver circuit includes a shift register 5601 and a switching circuit portion 5602. The switching circuit portion 5602 includes a plurality of switching circuits 5602_1 to 5602_N (N is a natural number). The switching circuits 5602_1 to 5602_N each include a plurality of thin film transistors 5603_1 to 5603__k_ (k is a natural number). An example in which the thin film transistors 5603_1 to 5603__k_ are n-channel TFTs is described.

A connection relation of the signal line driver circuit is described by using the switching circuit 5602_1 as an example. First terminals of the thin film transistors 5603_1 to 5603__k_ are connected to wirings 5604_1 to 5604__k_, respectively. Second terminals of the thin film transistors 5603_1 to 5603__k_ are connected to signal wirings S1 to Sk, respectively. Gates of the thin film transistors 5603_1 to 5603__k_ are connected to a wiring 5605_1.

The shift register 5601 has a function of sequentially outputting H level signals (also referred to as an H signal or a high power potential level) to the wirings 5605_1 to 5605_N, and a function of sequentially selecting the switching circuits 5602_1 to 5602_N.

The switching circuit 5602_1 has a function of controlling conduction states between the wirings 5604_1 to 5604__k_ and the signal lines S1 to Sk (conduction between the first terminal and the second terminal), that is, a function of controlling whether the electric potentials of the wirings 5604_1 to 5604__k_ are supplied or not to the signal lines S1 to Sk. In this manner, the switching circuit 5602_1 has a function of a selector. The thin film transistors 5603_1 to 5603__k_ have functions of controlling conduction states between the wirings 5604_1 to 5604__k_ and the signal lines S1 to Sk, that is, functions of supplying electric potentials of the wirings 5604_1 to 5604__k_ to the signal lines S1 to Sk, respectively. In this manner, each of the thin film transistors 5603_1 to 5603__k_ functions as a switch.

Note that the data for a video signal (DATA) is input to the wirings 5604_1 to 5604__k_. The data for a video signal (DATA) is an analog signal corresponding to image data or an image signal in many cases.

Next, operation of the signal line driver circuit illustrated in FIG. 10A is described with reference to a timing chart in FIG. 10B. In FIG. 10B, signals Sout_1 to Sout_N and signals Vdata_1 to Vdata_k are illustrated as an example. The signals Sout_1 to Sout_N are examples of output signals of the shift register 5601, and the signals Vdata_1 to Vdata_k are examples of signals which are input to the wirings 5604_1 to 5604__k_, respectively. Note that one operation period of the signal line driver circuit corresponds to one gate selection period in a display device. For example, one gate selection period is divided into periods T1 to TN. The periods T1 to TN are periods for writing the data for a video signal (DATA) to pixels in a selected TOW.

Note that signal waveform distortion and the like in each structure illustrated in drawings and the like in this embodiment are exaggerated for simplicity in some cases. Therefore, the present invention is not limited to such scales.

In the periods T1 to TN, the shift register 5601 sequentially outputs H level signals to the wirings 5605_1 to 5605_N. For example, in the period T1, the shift register 5601 outputs a high level signal to the wiring 5605_1. Then, the thin film transistors 5603_1 to 5603__k_ are turned on, so that the wirings 5604_1 to 5604__k_ and the signal lines S1 to Sk are brought into conduction. In this case, Data (S1) to Data (Sk) are input to the wirings 5604_1 to 5604__k_, respectively. The Data (S1) to Data (Sk) are input to pixels in a selected row in a first to k-th columns through the thin film transistors 5603_1 to 5603__k_, respectively. Thus, in the periods T1 to TN, the data for a video signal (DATA) is sequentially written to the pixels in the selected row by k columns.

By writing the data for a video signal (DATA) to pixels by a plurality of columns, the number of the data for a video signal (DATA) or the number of wirings can be reduced. Accordingly, the number of connections to external circuits can be reduced. Further, by writing a video signal to pixels of a plurality of columns each time, write time can be extended, and shortage of writing of a video signal can be prevented.

Note that for the shift register 5601 and the switching circuit portion 5602, a circuit formed using the thin film transistor described in Embodiments 1, 2, 5, or 6 can be used. In that case, all the transistors included in the shift register 5601 can be only n-channel transistors or only p-channel transistors.

The structure of a scan line driver circuit will be described. The scan line driver circuit includes a shift register. Additionally, the scan line driver circuit may include a level shifter, a buffer, or the like in some cases. In the scan line driver circuit, when the clock signal (CLK) and the start pulse signal (SP) are input to the shift register, a selection signal is generated. The generated selection signal is buffered and amplified by the buffer, and the resulting signal is supplied to a corresponding scan line. Gate electrodes of transistors in pixels of one line are connected to the scan line. Since the transistors in the pixels of one line have to be turned on all at once, a buffer which can feed a large amount of current is used.

One mode of a shift register which is used for part of a scan line driver circuit and/or a signal line driver circuit will be described with reference to FIGS. 11A to 11C and FIGS. 12A and 12B.

Figure 11A:
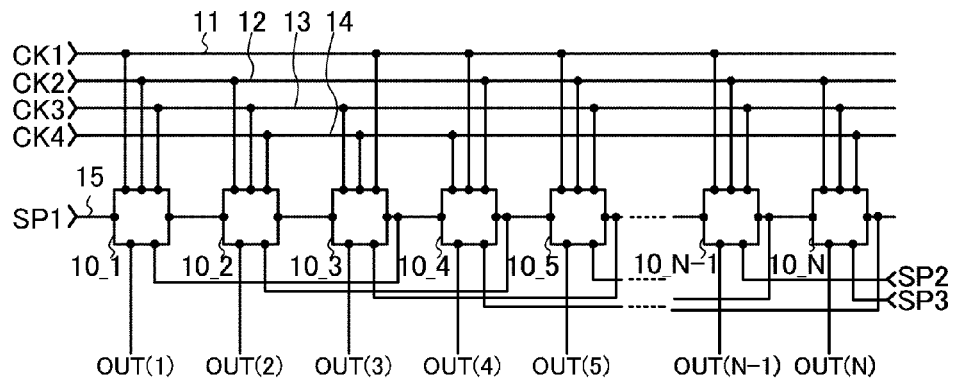
FIGS. 11A to 11D are circuit diagrams illustrating a structure of a shift register.

The shift register includes a first to N-th pulse output circuits 10_1 to 10_N (N is a natural number greater than or equal to 3) (see FIG. 11A). In the shift register illustrated in FIG. 11A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to N-th pulse output circuits 10_1 to 10_N. A start pulse SP1 (a first start pulse) is input from a fifth wiring 15 to the first pulse output circuit 10_1. To the n-th pulse output circuit 10__n_ (n is a natural number greater than or equal to 2 and less than or equal to N) in the second or later stage, a signal from the pulse output circuit in the preceding stage (such a signal is referred to as a preceding-stage signal OUT(n−1)) is input. A signal from the third pulse output circuit 10_3 in the stage that is two stages after the first pulse output circuit 10_1 is also input to the first pulse output circuit 10_1. In a similar manner, a signal from the (n+2)th pulse output circuit 10_(*n*+2) in the stage that is two stages after the n-th pulse output circuit 10_*n* (such a signal is referred to as a later-stage signal OUT(n+2)) is input to the n-th pulse output circuit 10_*n* in the second or later stage. Thus, the pulse output circuits in the respective stages output first output signals (OUT(1)(SR) to OUT (N)(SR)) to be input to the pulse output circuits in the respective subsequent stages and/or the pulse output circuits in the stages that are two stages before the respective pulse output circuits and second output signals (OUT(1) to OUT (N)) to be input to other circuits or the like. Note that as illustrated in FIG. 11A, since the later-stage signal OUT(n+2) is not input to the pulse output circuits in the last two stages of the shift register, for example, a second start pulse SP2 and a third start pulse SP3 may be additionally input to the respective pulse output circuits.

Note that a clock signal (CK) is a signal which alternates between an H level signal and an L level signal (also referred to as an L signal or a low power supply potential level) at a regular interval. Here, the first to fourth clock signals (CK1) to (CK4) are sequentially delayed by a quarter of a cycle. In this embodiment, by using the first to fourth clock signals (CK1) to (CK4), control or the like of driving of a pulse output circuit is performed. Although the clock signal is used as a GCK or an SCK in accordance with a driver circuit to which the clock signal is input, the clock signal is described as a CK here.

A first input terminal 21, a second input terminal 22, and a third input terminal 23 are electrically connected to any of the first to fourth wirings 11 to 14. For example, in FIG. 11A, the first input terminal 21 of the first pulse output circuit 10_1 is electrically connected to the first wiring 11, the second input terminal 22 of the first pulse output circuit 10_1 is electrically connected to the second wiring 12, and the third input terminal 23 of the first pulse output circuit 10_1 is electrically connected to the third wiring 13. In addition, the first input terminal 21 of the second pulse output circuit 10_2 is electrically connected to the second wiring 12, the second input terminal 22 of the second pulse output circuit 10_2 is electrically connected to the third wiring 13, and the third input terminal 23 of the second pulse output circuit 10_2 is electrically connected to the fourth wiring 14.

Figure 11B:
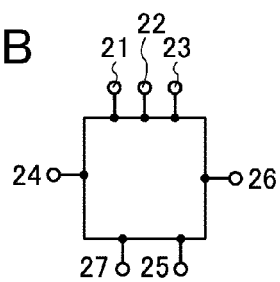

Each of the first to N-th pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 11B). In the first pulse output circuit 10_1, the first clock signal CK1 is input to the first input terminal 21, the second clock signal CK2 is input to the second input terminal 22, the third clock signal CK3 is input to the third input terminal 23, the start pulse is input to the fourth input terminal 24, a subsequent stage signal OUT (3) is input to the fifth input terminal 25, a first output signal OUT (1) (SR) is output from the first output terminal 26, and a second output signal OUT (1) is output from the second output terminal 27.

Figure 11C:
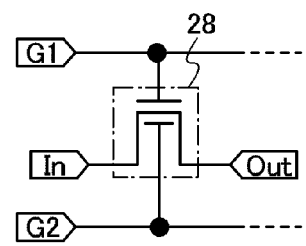

In the first to N-th pulse output circuits 10_1 to 10_N, the thin film transistor (TFT) having four terminals described in the above embodiment can be used in addition to a thin film transistor having three terminals. FIG. 11C illustrates the symbol of the thin film transistor 28 having four terminals, which is described in the above embodiment. The symbol of the thin film transistor 28 illustrated in FIG. 11C represents the thin film transistor having four terminals which is described in any of Embodiments 1, 2, 5, and 6 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control current between an IN terminal and an OUT terminal with a first control signal G1 which is input to a lower gate electrode and a second control signal G2 which is input to an upper gate electrode.

When a semiconductor layer including a channel formation region of a thin film transistor is formed using an oxide semiconductor, a threshold voltage is shifted in a negative or positive direction in some cases depending on a manufacturing process. Thus, a thin film transistor in which an oxide semiconductor is used for a semiconductor layer including a channel formation region favorably has a structure with which a threshold voltage can be controlled. The threshold voltage of the thin film transistor 28 illustrated in FIG. 11C can be controlled to be at a desired level by providing gate electrodes above and below a channel formation region of the thin film transistor 28 with a gate insulating film interposed between the upper gate electrode and the channel formation region and between the lower gate electrode and the channel formation region, and by controlling an electric potential of the upper gate electrode and/or a potential of the lower gate electrode.

Next, an example of a specific circuit structure of the pulse output circuit illustrated in FIG. 11B is described with reference to FIG. 11D.

Figure 11D:
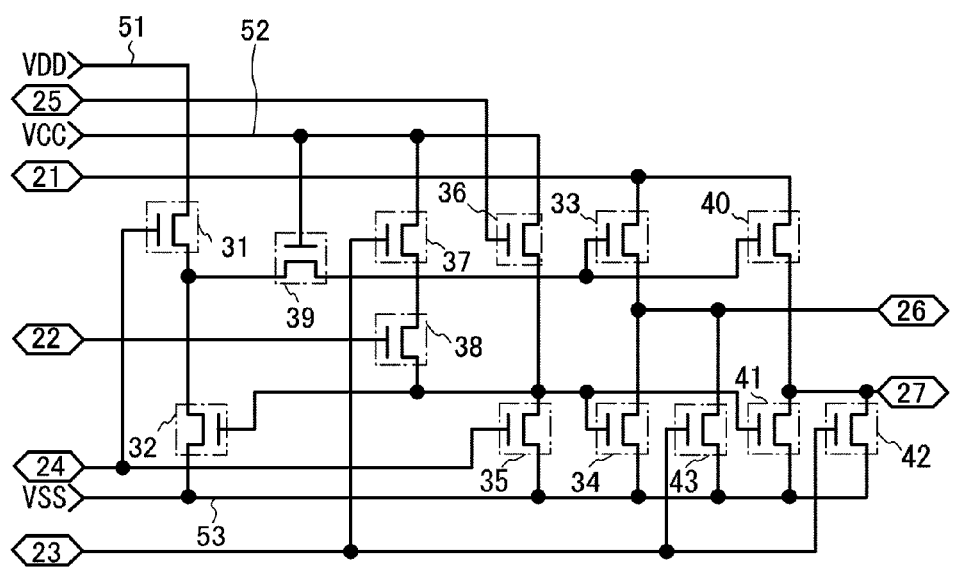

The pulse output circuit illustrated in FIG. 11D includes first to thirteenth transistors 31 to 43. In addition to the first to fifth input terminals 21 to 25, the first output terminal 26, and the second output terminal 27, signals or power supply potentials are supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied. Here, the magnitude relation among power supply potentials of the power supply lines illustrated in FIG. 11D is set as follows: the first power supply potential VDD is higher than or equal to the second power supply potential VCC, and the second power supply potential VCC is higher than the third power supply potential VSS. Although the first to fourth clock signals (CK1) to (CK4) are signals which alternate between an H level signal and an L level signal at a regular interval, an electric potential is VDD when the clock signal is at an H level, and an electric potential is VSS when the clock signal is at an L level. Note that the electric potential VDD of the power supply line 51 is higher than the electric potential VCC of the power supply line 52, so that there is no effect on an operation, the electric potential applied to a gate electrode of a transistor can be low, a shift of the threshold voltage of the transistor can be reduced, and deterioration can be suppressed. A thin film transistor having four terminals is preferably used as the first transistor 31 and the sixth to ninth transistors 36 to 39 among the first to thirteenth transistors 31 to 43. The first transistor 31 and the sixth to ninth transistors 36 to 39 need to operate so that an electric potential of a node to which one electrode serving as a source or a drain is connected is switched with a control signal of the gate electrode, and can further reduce malfunction of the pulse output circuit because response to the control signal input to the gate electrode is fast (the rise of on-state current is steep). Thus, with the use of the thin film transistor having four terminals, the threshold voltage can be controlled, and malfunction of the pulse output circuit can be further prevented.

In FIG. 11D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. A first terminal of the ninth transistor 39 is electrically connected to the second terminal of the first transistor 31 and the second terminal of the second transistor 32, a second terminal of the ninth transistor 39 is electrically connected to the gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and a gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 11D, a connection portion of the gate electrode of the third transistor 33, the gate electrode of the tenth transistor 40, and the second terminal of the ninth transistor 39 is a node A. A connection portion of the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 is a node B (see FIG. 12A).

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may change depending on the structure, the operating condition, and the like of the thin film transistor, it is difficult to define which is a source or a drain. Therefore, a region functioning as a source or a drain is not called the source or the drain in some cases. In such a case, for example, one of the source and the drain may be referred to as a first terminal and the other thereof may be referred to as a second terminal.

Figure 12A:
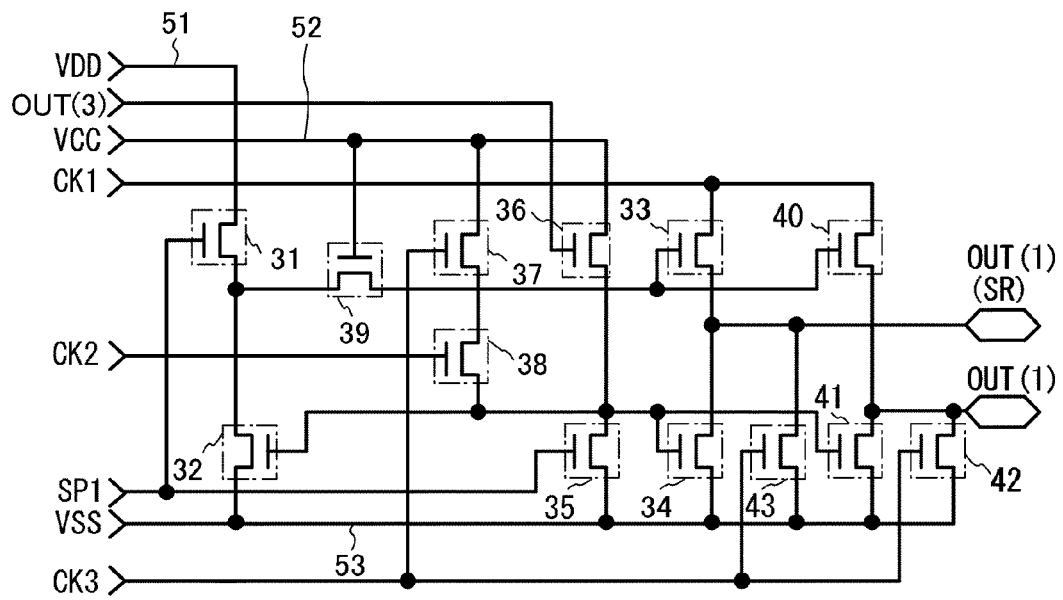
FIGS. 12A and 12B are a circuit diagram and a timing chart illustrating operation of a shift register.

Note that in FIG. 11D and FIG. 12A, a capacitor may be additionally provided in order to perform bootstrap operation effected by the node A in a floating state. A capacitor whose one electrode is electrically connected to the node B may be provided in order to hold the electric potential of the node B.

Figure 12B:
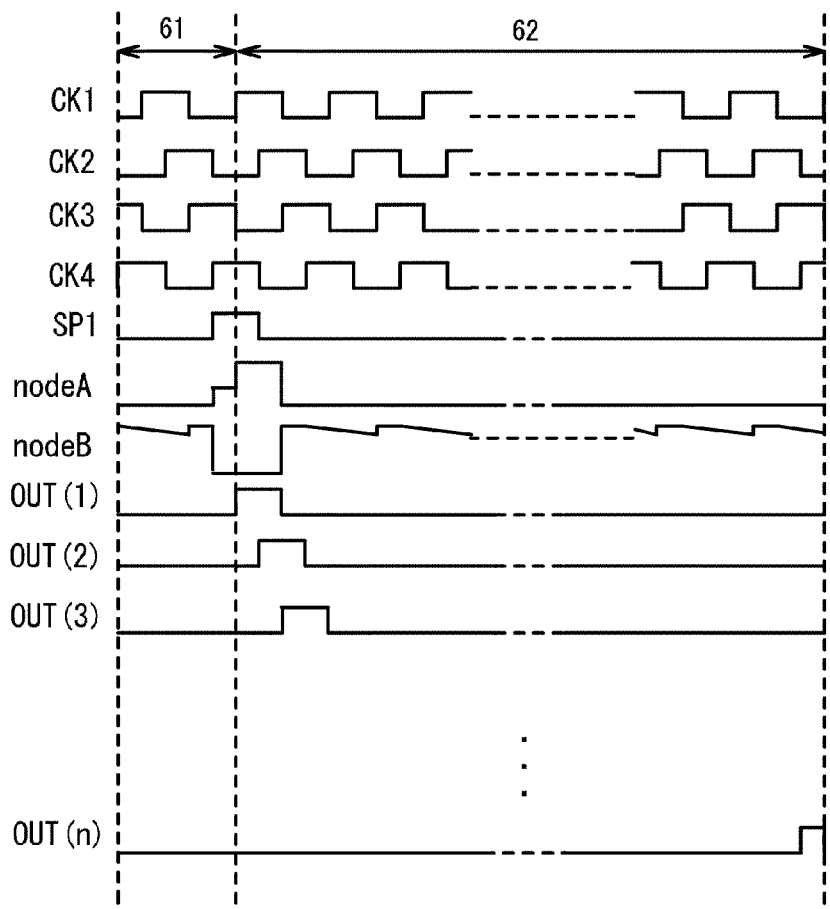

Here, a timing chart of a shift register in which a plurality of pulse output circuits illustrated in FIG. 12A is provided is illustrated in FIG. 12B. Note that in FIG. 12B, when the shift register is a scan line driver circuit, a period 61 is a vertical retrace period and a period 62 is a gate selection period.

Note that as illustrated in FIG. 12A, when the ninth transistor 39 having the gate to which the second power supply potential VCC is applied is provided, there are the following advantages before or after the bootstrap operation.

Without the ninth transistor 39 whose gate electrode is supplied with the second power supply potential VCC, when an electric potential of the node A is raised by bootstrap operation, an electric potential of a source which is the second terminal of the first transistor 31 increases to a value higher than the first power supply potential VDD. Then, the source of the first transistor 31 is switched to the first terminal side, that is, the power supply line 51 side. Therefore, in the first transistor 31, a large amount of bias voltage is applied and thus great stress is applied between a gate and a source and between the gate and a drain, which can cause deterioration in the transistor. When the ninth transistor 39 is provided whose gate electrode is supplied with the second power supply potential VCC, an electric potential of the node A is raised by bootstrap operation, but at the same time, an increase in an electric potential of the second terminal of the first transistor 31 can be prevented. In other words, with the ninth transistor 39, negative bias voltage applied between a gate and a source of the first transistor 31 can be reduced. Accordingly, with a circuit structure in this embodiment, negative bias voltage applied between the gate and the source of the first transistor 31 can be reduced, so that deterioration in the first transistor 31, which is due to stress, can further be restrained.

Note that the ninth transistor 39 may be provided in any places where the ninth transistor 39 is connected between the second terminal of the first transistor 31 and the gate of the third transistor 33 through the first terminal and the second terminal When a shift register includes a plurality of pulse output circuits in this embodiment, the ninth transistor 39 may be omitted in a signal line driver circuit which has a larger number of stages than a scan line driver circuit, and the number of transistors can be decreased.

Note that when oxide semiconductors are used for semiconductor layers of the first to the thirteenth transistors 31 to 43, the off-state current of the thin film transistors can be reduced, the on-state current and the field effect mobility can be increased, and the degree of deterioration can be reduced, whereby malfunction of a circuit can decrease. Moreover, the degree of deterioration of the transistor using an oxide semiconductor by application of a high electric potential to a gate electrode is smaller than that of a transistor using amorphous silicon. Therefore, similar operation can be obtained even when the first power supply potential VDD is supplied to the power supply line which supplies the second power supply potential VCC, and the number of power supply lines which are led between circuits can decrease; therefore, the size of the circuit can be reduced.

Note that a similar function is obtained even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 are supplied from the second input terminal 22 and the third input terminal 23, respectively. In this case, in the shift register illustrated in FIG. 12A, the state is changed from the state where both the seventh transistor 37 and the eighth transistor 38 are turned on, to the state where the seventh transistor 37 is turned off and the eighth transistor 38 is turned on, and then to the state where both the seventh transistor 37 and the eighth transistor 38 are turned off; thus, the fall in an electric potential of the node B due to fall in the electric potentials of the second input terminal 22 and the third input terminal 23 is caused twice by fall in the electric potential of the gate electrode of the seventh transistor 37 and fall in the electric potential of the gate electrode of the eighth transistor 38. On the other hand, in the shift register illustrated in FIG. 12A, the state is changed from the state where both the seventh transistor 37 and the eighth transistor 38 are turned on to the state where the seventh transistor 37 is turned on and the eighth transistor 38 is turned off, and then to the state where both the seventh transistor 37 and the eighth transistor 38 are turned off. Accordingly, the fall in an electric potential of the node B due to fall in electric potentials of the second input terminal 22 and the third input terminal 23 is reduced to one, which is caused by fall in an electric potential of the gate electrode of the eighth transistor 38. Therefore, the connection relation, that is, the clock signal CK3 is supplied from the third input terminal 23 to the gate electrodes (the lower gate electrode and the upper gate electrode) of the seventh transistor 37 and the clock signal CK2 is supplied from the second input terminal 22 to the gate electrodes (the lower gate electrode and the upper gate electrode) of the eighth transistor 38, is preferable. That is because the number of times of the change in the electric potential of the node B can be reduced and the noise can be decreased.

In this way, in a period during which the electric potential of the first output terminal 26 and the electric potential of the second output terminal 27 are each held at an L level, an H level signal is regularly supplied to the node B; therefore, malfunction of the pulse output circuit can be suppressed.

Embodiment 8

In this embodiment, an example of a manufacturing process of a thin film transistor, which is partly different from that of Embodiment 1, will be described with reference to FIGS. 8A to 8E. FIGS. 8A to 8E are the same as FIGS. 1A to 1E except part of the process, which is different from FIGS. 1A to 1E, and therefore, the same portions are denoted by the same reference numerals, and specific description of the same portions is omitted.

First, in accordance with Embodiment 1, two gate electrode layers and a gate insulating layer 402 are formed over a substrate, and a source electrode layer 455a and a drain electrode layer 455b are formed to partly overlap with one of the gate electrode layers with the gate insulating layer therebetween. Then, an oxide semiconductor film is formed over the gate insulating layer 402, the source electrode layer 455a, and the drain electrode layer 455b.

Next, dehydration or dehydrogenation of the oxide semiconductor film is performed. First heat treatment for dehydration or dehydrogenation is performed at a temperature higher than or equal to 400° C. and lower than the strain point of the substrate, preferably higher than or equal to 425° C., or more preferably, higher than or equal to 600° C. and lower than or equal to 700° C. In the case where the temperature is higher than or equal to 425° C., the heat treatment time may be one hour or shorter, whereas in the case where the temperature is lower than 425° C., the heat treatment time is longer than one hour. Here, an oxide semiconductor film is obtained in such a manner that: the substrate is introduced into an electric furnace that is a kind of heat treatment apparatus; the oxide semiconductor film is subjected to the heat treatment in a nitrogen atmosphere; and after that, the oxide semiconductor film is not exposed to air, which prevents water or hydrogen from entering the oxide semiconductor film. After that, a high-purity oxygen gas or a $N_2O$ gas, or an ultra dry air (with a dew point of −40° C. or lower, preferably −60° C. or lower) is introduced into the same furnace, so that slow cooling is performed. It is preferable that water, hydrogen, or the like be not contained in the oxygen gas or the $N_2O$ gas. Alternatively, the purity of the oxygen gas or the $N_2O$ gas which is introduced into the heat treatment apparatus is preferably 6N (99.9999%) or more, more preferably 7N (99.99999%) or more (i.e., the concentration of impurities in the oxygen gas or the $N_2O$ gas is preferably 1 ppm or less, more preferably 0.1 ppm or less). Note that a heat treatment apparatus used is not limited to an electric furnace; for example, an RTA (rapid thermal anneal) apparatus such as a GRTA (gas rapid thermal anneal) apparatus or an LRTA (lamp rapid thermal anneal) apparatus can be used.

Further, after the first heat treatment for dehydration or dehydrogenation, heat treatment in an oxygen gas or a $N_2O$ gas at a temperature higher than or equal to 200° C. and lower than or equal to 400° C., preferably higher than or equal to 200° C. and lower than or equal to 300° C. may be performed.

Through the above process, the oxide semiconductor film is made to be in an oxygen-excess state so as to be a high-resistance oxide semiconductor film, i.e., an i-type oxide semiconductor film. Although the first heat treatment for dehydration or dehydrogenation is performed just after the formation of the oxide semiconductor film in this embodiment, the first heat treatment for dehydration or dehydrogenation can be performed anytime after the formation of the oxide semiconductor film.

Next, the oxide semiconductor film and the gate insulating layer 402 are selectively etched by a photolithography step, so that a contact hole reaching the gate electrode layer 421b is formed. By formation of a resist over the oxide semiconductor film, contamination in the interface between the gate insulating layer 402 and the oxide semiconductor film can be prevented. Then, the resist mask is removed (see FIG. 8A).

Next, after the resist mask is removed, another resist mask is formed, and the oxide semiconductor film is selectively etched to be island-shaped oxide semiconductor layers. Then, the resist mask is removed, so that oxide semiconductor layers 404 and 405 over the gate insulating layer 402 are obtained (see FIG. 8B).

Next, an oxide insulating film is formed over the gate insulating layer 402 and the oxide semiconductor layers 404 and 405 by a sputtering method. Then, a resist mask is formed by a photolithography step, and selective etching is performed to form an oxide insulating layer 426. After that, the resist mask is removed. At this stage, the region that overlaps with the oxide insulating layer 426 covering the peripheral portion and side surface of the oxide semiconductor layer is formed. By the photolithography step, a contact hole reaching the gate electrode layer 421b and a contact hole reaching the drain electrode layer 455b are also formed (see FIG. 8C).

As the oxide insulating film, an inorganic insulating film that does not contain an impurity such as moisture, a hydrogen ion, or OH− and blocks entry of these from the outside may be used. Typically, a silicon oxide film, a silicon nitride oxide film, an aluminum oxide film, an aluminum oxynitride film, or the like is used.

Next, an oxide conductive film and a metal conductive film are stacked over the gate insulating layer 402, the oxide insulating layer 426, and the oxide semiconductor layer. By using a sputtering method, the oxide conductive film and the metal conductive film can be formed in succession without exposure to air.

It is preferable that the oxide conductive film be a film not containing an indium oxide but containing a zinc oxide as a component. As materials of such an oxide conductive film, a zinc oxide, a zinc aluminum oxide, a zinc aluminum oxynitride, a zinc gallium oxide, and the like can be given. In this embodiment, a zinc oxide film is used.

As a material of the metal conductive film, an element selected from Ti, Mo, W, Al, Cr, Cu, and Ta, an alloy containing any of the above elements as a component, an alloy containing these elements in combination, or the like is used. The metal conductive film is not limited to a single layer containing the above-described element and may be two or more layers. In this embodiment, a three-layer film in which a molybdenum film, an aluminum film, and a molybdenum film are stacked is formed.

Next, a resist mask is formed and the metal conductive film is selectively etched, so that a source electrode layer 445a, a drain electrode layer 445b, a connection electrode layer 449, and a connection electrode layer 442 are formed. Then, the resist mask is removed. A resist stripper used for removing the resist mask is an alkaline solution, and in the case where the resist stripper is used, the zinc oxide film is selectively etched with the source electrode layer 445a, the drain electrode layer 445b, the connection electrode layer 449, and the connection electrode layer 442 as masks. In this manner, an oxide conductive layer 446a is formed under and in contact with the source electrode layer 445a, and an oxide conductive layer 446b is formed under and in contact with the drain electrode layer 445b. By providing the oxide conductive layer 446a between the source electrode layer 445a and the oxide semiconductor layer, contact resistance can be reduced, which leads to a reduction in resistance, so that a thin film transistor with high speed operation can be formed. The oxide conductive layer 446a provided between the source electrode layer 445a and the oxide semiconductor layer functions as a source region, and the oxide conductive layer 446b provided between the drain electrode layer 445b and the oxide semiconductor layer functions as a drain region, which are effective in improving the frequency characteristics of a peripheral circuit (driver circuit). In the case where the molybdenum film and the oxide semiconductor layer are directly in contact with each other, the contact resistance is increased. This is because Mo is not readily oxidized as compared with Ti and thus extracts a small amount of oxygen from the oxide semiconductor layer, which does not allow the interface between Mo and the oxide semiconductor layer to have n-type conductivity. However, even in that case, by providing the oxide conductive layer 446a between the source electrode layer and the oxide semiconductor layer and providing the oxide conductive layer 446b between the drain electrode layer and the oxide semiconductor layer, the contact resistance can be reduced, and the frequency characteristics of the peripheral circuit (driver circuit) can be improved.

Figure 8A:
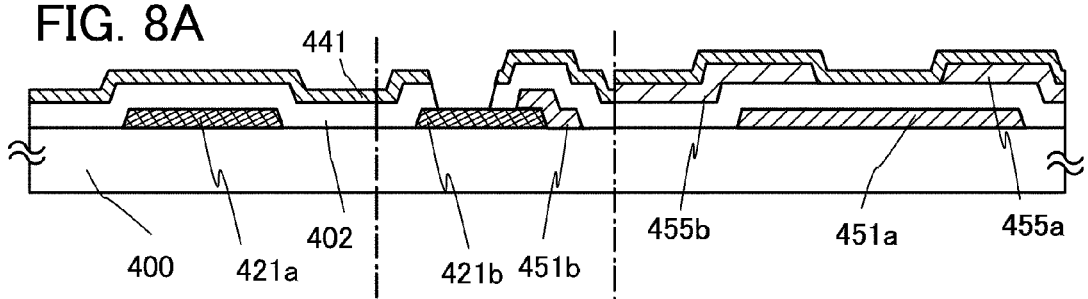
FIGS. 8A to 8E are cross-sectional views illustrating one embodiment of the present invention.
Figure 8B:
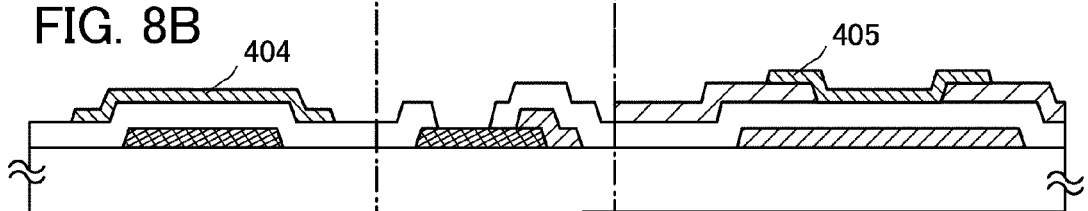
Figure 8C:
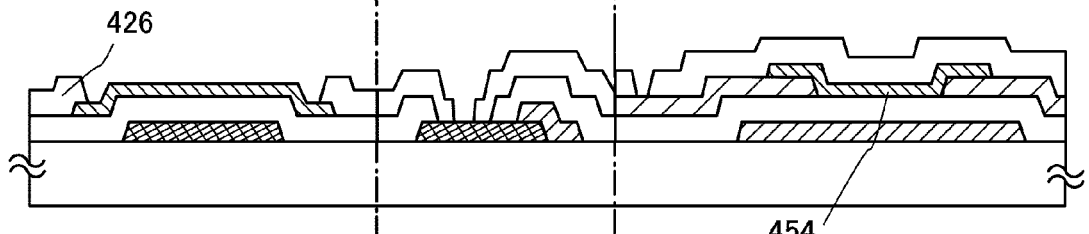
Figure 8D:
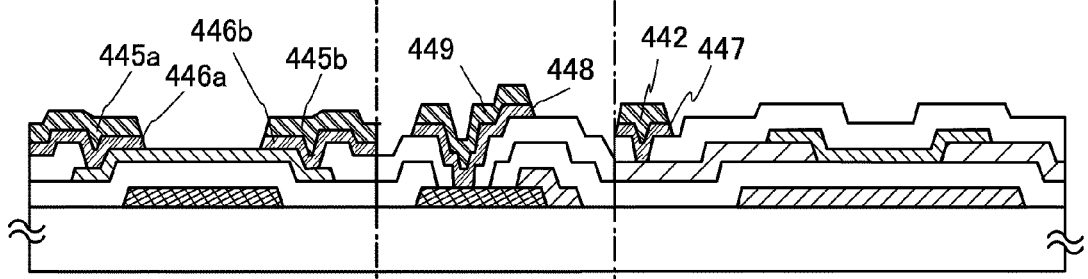

Further, by the same step, an oxide conductive layer 448 is formed under and in contact with the connection electrode layer 449, and an oxide conductive layer 447 is formed under and in contact with the connection electrode layer 442 (see FIG. 8D). By forming the oxide conductive layer 448 between the connection electrode layer 449 and the gate electrode layer 421b, buffer is formed, which is preferable, and an insulating oxide is not formed with a metal, which is preferable.

The etching rate is different between the oxide semiconductor layer and the oxide conductive layer, and therefore, the oxide conductive layer which is on and in contact with the oxide semiconductor layer can be removed by controlling the etching time.

After the metal conductive film is selectively etched, the resist mask may be removed by oxygen ashing treatment to leave the zinc oxide film, and then, the zinc oxide film may be selectively etched with the source electrode layer 445a, the drain electrode layer 445b, the connection electrode layer 449, and the connection electrode layer 442 as masks.

In the case where the first heat treatment is performed after the metal conductive film is selectively etched, the oxide conductive layers 446a, 446b, 447, and 448 are crystallized as long as a crystallization inhibitor is not contained in the oxide conductive layers 446a, 446b, 447, and 448. On the other hand, the oxide semiconductor layer is not crystallized by the first heat treatment and is kept to be amorphous. A crystal of the oxide conductive layer grows in a columnar shape from a base surface. As a result, when the metal film over the oxide conductive layer is etched to form the source and drain electrodes, formation of an undercut in the oxide conductive layer can be prevented.

Next, second heat treatment (preferably at a temperature higher than or equal to 150° C. and lower than 350° C.) may be performed in an inert gas atmosphere or a nitrogen gas atmosphere in order to reduce variations of the electric characteristics of thin film transistors. For example, heat treatment in a nitrogen atmosphere at 250° C. for one hour is performed. Note that oxygen is introduced into and diffused to the oxide semiconductor layer from the oxide insulating film or the like in contact with the oxide semiconductor layer by the second heat treatment, which can change the channel formation region into a high-resistance channel formation region (i.e., an i-type channel formation region). Accordingly, a normally-off thin film transistor can be obtained. The oxide conductive layers 446a, 446b, 447, and 448 can be crystallized by the second heat treatment, so that the conductivity can be improved.

Figure 8E:
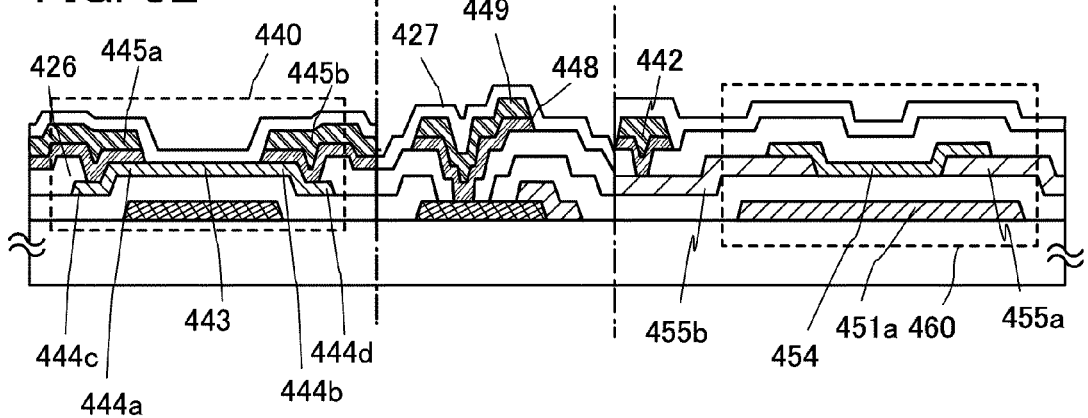

Next, an insulating layer 427 is formed over the oxide insulating layer 426, the source electrode layer 445a, and the drain electrode layer 445b (see FIG. 8E).

Through the above process, a thin film transistor 440 and the thin film transistor 460 can be manufactured over the same substrate.

The thin film transistor 440 provided in the driver circuit includes, over the substrate 400 having an insulating surface, the gate electrode layer 421a, the gate insulating layer 402, the oxide semiconductor layer including at least a channel formation region 443, a high-resistance source region 444a, and a high-resistance drain region 444b, the oxide conductive layers 446a and 446b, the source electrode layer 445a, and the drain electrode layer 445b. Further, the insulating layer 427 is provided over the channel formation region 443, the source electrode layer 445a and the drain electrode layer 445b.

The oxide conductive layer 446a which functions as a source region is provided between the high-resistance source region 444a and the source electrode layer 445a and the oxide conductive layer 446b which functions as a drain region is provided between the high-resistance drain region 444b and the drain electrode layer 445b, whereby the contact resistance can be reduced.

A first region 444c and a second region 444d of the oxide semiconductor layer, which overlap with the oxide insulating layer 426, are in an oxygen-excess state like the channel formation region 443; thus, the leak current can be reduced and the parasitic capacitance can be reduced.

This embodiment can be combined with any of the other embodiments.

Embodiment 9

A light-emitting device disclosed in this specification can be applied to a variety of electronic appliances (including amusement machines). Examples of electronic appliances include a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, and the like.

Figure 13A:
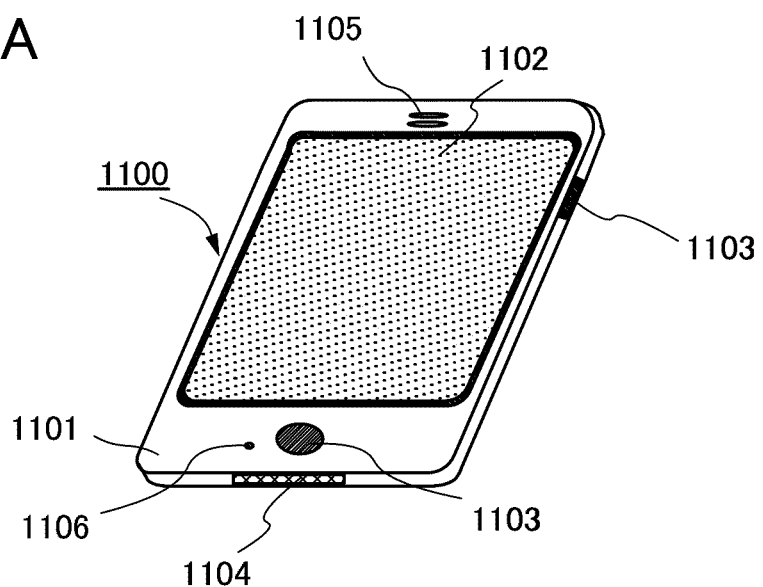
FIGS. 13A and 13B are views illustrating electronic appliances.

FIG. 13A illustrates an example of a mobile phone. A mobile phone 1100 includes a display portion 1102 incorporated in a housing 1101, operation buttons 1103, an external connection port 1104, a speaker 1105, a microphone 1106 and the like.

When the display portion 1102 of the mobile phone 1100 illustrated in FIG. 13A is touched with a finger or the like, data can be input into the mobile phone 1100. Furthermore, operations such as making calls and composing mails can be performed by touching the display portion 1102 with a finger or the like.

There are mainly three screen modes of the display portion 1102. The first mode is a display mode mainly for displaying images. The second mode is an input mode mainly for inputting data such as text. The third mode is a display-and-input mode in which two modes of the display mode and the input mode are combined.

For example, in the case of making calls or composing mails, a text input mode mainly for inputting text is selected for the display portion 1102 so that text displayed on a screen can be input. In that case, it is preferable to display a keyboard or number buttons on almost all area of the screen of the display portion 1102.

When a detection device including a sensor for detecting inclination, such as a gyroscope or an acceleration sensor, is provided inside the mobile phone 1100, display on the screen of the display portion 1102 can be automatically switched by determining the installation direction of the mobile phone 1100 (whether the mobile phone 1100 is placed horizontally or vertically for a landscape mode or a portrait mode).

The screen modes are switched by touching the display portion 1102 or operating the operation buttons 1103 of the housing 1101. Alternatively, the screen modes can be switched depending on the kind of the image displayed on the display portion 1102. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1102 is not performed for a certain period while a signal detected by an optical sensor in the display portion 1102 is detected, the screen mode may be controlled so as to be switched from the input mode to the display mode.

The display portion 1102 can function as an image sensor. For example, an image of a palm print, a fingerprint, or the like is taken when the display portion 1102 is touched with a palm or a finger, whereby personal identification can be performed. Further, by providing a backlight which emits near-infrared light or a sensing light source which emits near-infrared light for the display portion, an image of a finger vein, a palm vein, or the like can be taken.

A plurality of the thin film transistors 460 described in Embodiment 1 is arranged in the display portion 1102. Since the thin film transistors 460 have light-transmitting properties, they do not block incident light in the case of providing an optical sensor for the display portion 1102 and thus are effective. In addition, also in the case of providing a backlight which emits near-infrared light or a sensing light source which emits near-infrared light for the display portion, the thin film transistors 460 do not block light and thus are effective.

Figure 13B:
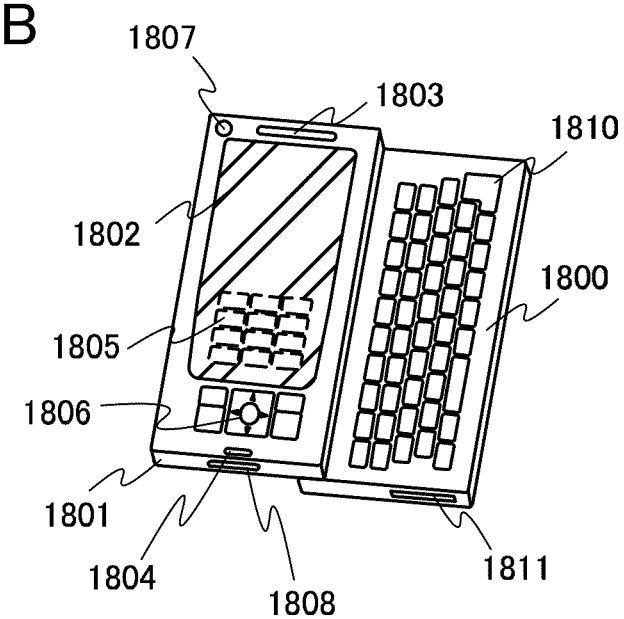

FIG. 13B also illustrates an example of a mobile phone. A portable information terminal whose example is illustrated in FIG. 13B can have a plurality of functions. For example, in addition to a telephone function, such a portable information terminal can have a function of processing a variety of pieces of data by incorporating a computer.

The portable information terminal illustrated in FIG. 13B has a housing 1800 and a housing 1801. The housing 1801 includes a display panel 1802, a speaker 1803, a microphone 1804, a pointing device 1806, a camera lens 1807, an external connection terminal 1808, and the like. The housing 1800 includes a keyboard 1810, an external memory slot 1811, and the like. In addition, an antenna is incorporated in the housing 1801.

The display panel 1802 is provided with a touch panel. A plurality of operation keys 1805 which is displayed as images is illustrated by dashed lines in FIG. 13B.

Further, in addition to the above structure, a contactless IC chip, a small memory device, or the like may be incorporated.

The light-emitting device of the present invention can be used for the display panel 1802 and the direction of display is changed appropriately depending on an application mode.

Further, the camera lens 1807 is provided on the same surface as the display panel 1802, and thus a videophone is realized. The speaker 1803 and the microphone 1804 can be used for videophone calls, recording, and playing sound, etc. as well as voice calls. Moreover, the housings 1800 and 1801 in a state where they are developed as illustrated in FIG. 13B can shift so that one is lapped over the other by sliding; therefore, the size of the portable information terminal can be reduced, which makes the portable information terminal suitable for being carried.

The external connection terminal 1808 can be connected to an AC adapter and various types of cables such as a USB cable, and charging and data communication with a personal computer are possible. Moreover, a storage medium can be inserted into the external memory slot 1811 so that a large amount of data can be stored and can be moved.

Further, in addition to the above functions, an infrared communication function, a television reception function, or the like may be provided.

Figure 14A:
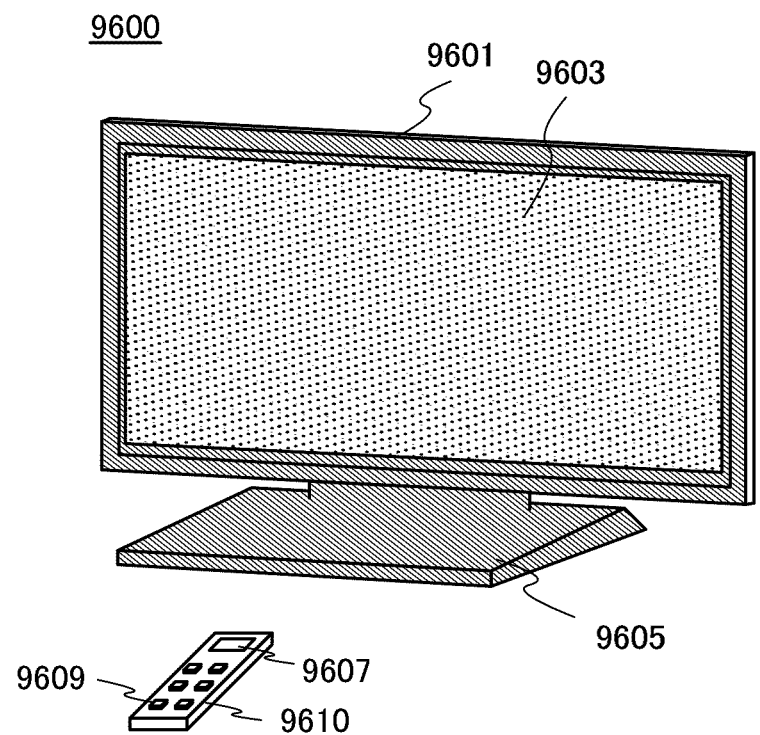
FIGS. 14A and 14B are views illustrating electronic appliances.

FIG. 14A illustrates an example of a television set. In a television set 9600, a display portion 9603 is incorporated in a housing 9601. Images can be displayed on the display portion 9603. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With the receiver, a general television broadcast can be received. Furthermore, when the television set 9600 is connected to a communication network by wired or wireless connection via the modem, one-way (from a transmitter to a receiver) or two-way (between a transmitter and a receiver, between receivers, or the like) data communication can be performed.

Since a plurality of the thin film transistors 460 described in Embodiment 1 is arranged in the display portion 9603, an aperture ratio can be high particularly when the light-emitting device has a bottom-emission structure.

Figure 14B:
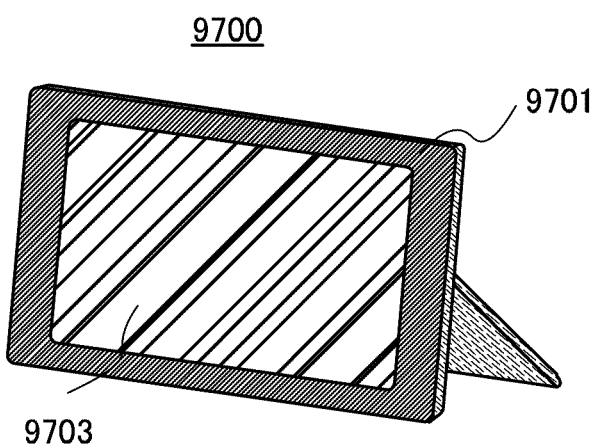

FIG. 14B illustrates an example of a digital photo frame. For example, in a digital photo frame 9700, a display portion 9703 is incorporated in a housing 9701. Various images can be displayed on the display portion 9703. For example, the display portion 9703 can display data of an image shot by a digital camera or the like to function as a normal photo frame.

Since a plurality of the thin film transistors 460 described in Embodiment 1 is arranged in the display portion 9703, an aperture ratio can be high particularly when the light-emitting device has a bottom-emission structure.

Note that the digital photo frame 9700 is provided with an operation portion, an external connection terminal (a USB terminal, a terminal that can be connected to various cables such as a USB cable, or the like), a recording medium insertion portion, and the like. Although they may be provided on the same surface as the display portion, they are preferably provided on the side surface or the back surface for the design of the digital photo frame 9700. For example, a memory storing data of an image shot by a digital camera is inserted into the recording medium insertion portion of the digital photo frame, whereby the image data can be transferred and displayed on the display portion 9703.

The digital photo frame 9700 may have a configuration capable of wirelessly transmitting and receiving data. Through wireless communication, desired image data can be transferred to be displayed.

Figure 15:
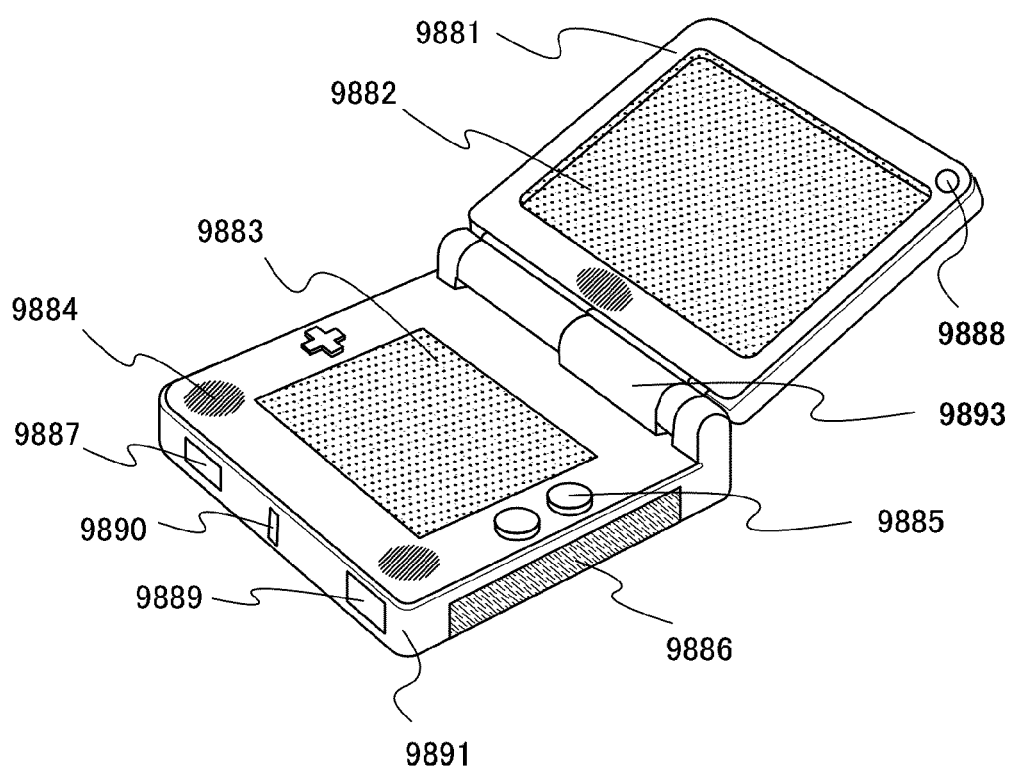
FIG. 15 is a view illustrating an electronic appliance.

FIG. 15 illustrates a portable amusement machine including two housings: a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively.

Since a plurality of the thin film transistors 460 described in Embodiment 1 is arranged in the display portion 9883, an aperture ratio can be high particularly when the light-emitting device has a bottom-emission structure.

In addition, the portable amusement machine illustrated in FIG. 15 includes a speaker portion 9884, a recording medium insertion portion 9886, an LED lamp 9890, an input tool (an operation key 9885, a connection terminal 9887, a sensor 9888 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), or a microphone 9889), and the like. It is needless to say that the structure of the portable amusement machine is not limited to the above and other structures provided with at least a thin film transistor disclosed in this specification can be employed. The portable amusement machine may include other accessory equipment as appropriate. The portable amusement machine illustrated in FIG. 15 has a function of reading a program or data stored in a recording medium to display it on the display portion, and a function of sharing information with another portable amusement machine by wireless communication. The portable amusement machine illustrated in FIG. 15 can have various functions without limitation to the above.

Figure 16:
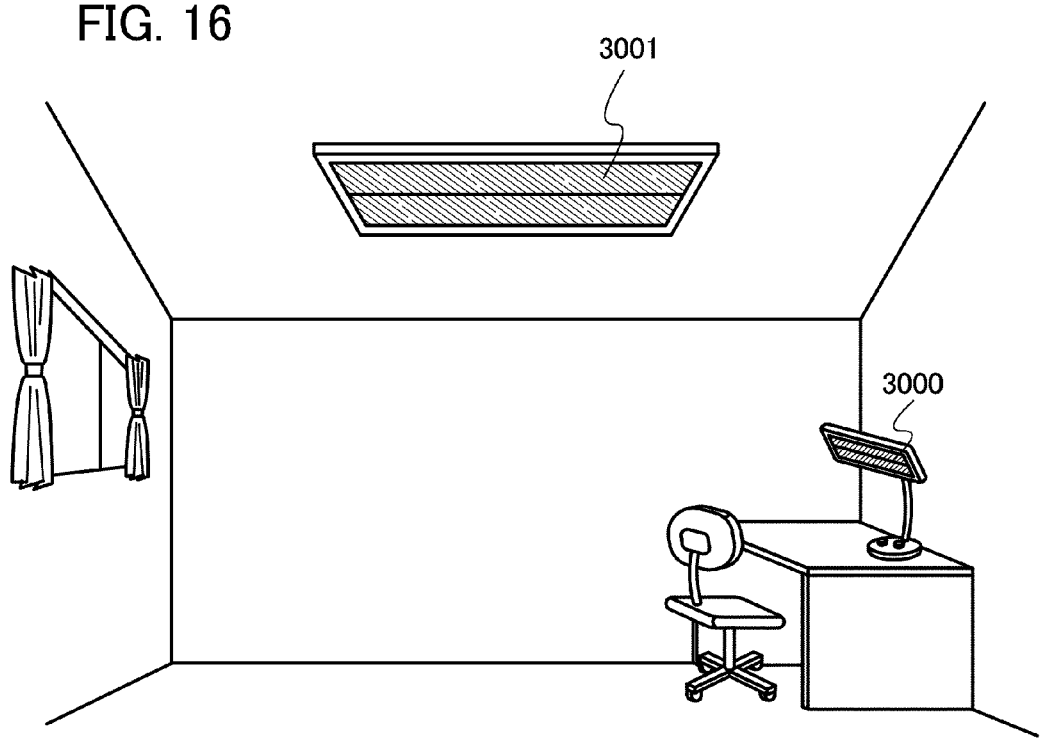
FIG. 16 is a view illustrating electronic devices.

FIG. 16 illustrates an example in which the light-emitting device formed in accordance with the above embodiment is used as an indoor lighting device 3001. Since the light-emitting device described in Embodiment 2 can be increased in area, the light-emitting device can be used as a lighting device having a large area. In addition, the light-emitting device described in Embodiment 2 can be also used as a desk lamp 3000. Note that lighting equipment includes in its category, a wall light, a lighting device for an inside of a car, a guide light and the like, as well as a ceiling light and a desk lamp.

As described above, the light-emitting device described in Embodiments 2 and 3 can be arranged in a display panel of a variety of electronic appliances such as the above ones. A highly reliable electronic appliance having a display portion with a high aperture ratio can be provided by using the thin film transistor 450 the thin film transistor 460 as the driver circuit and a switching element of the display panel, respectively, particularly when the light-emitting device has a bottom-emission structure.

This application is based on Japanese Patent Application serial no. 2009-205075 filed with Japan Patent Office on Sep. 4, 2009, the entire contents of which are hereby incorporated by reference.

EXPLANATION OF REFERENCE

400: substrate, 402: gate insulating layer, 403: oxide semiconductor layer, 404: oxide semiconductor layer, 411: first terminal, 412: connection electrode layer, 414: second terminal, 415: conductive layer, 416: electrode layer, 417:

conductive layer, 418: conductive layer, 421*a*: gate electrode layer, 421*b*: gate electrode layer, 421*c*: gate wiring layer, 422: source wiring layer, 423: channel formation region, 424*a*: high-resistance source region, 424*b*: high-resistance drain region, 424*c*: first region, 424*d*: second region, 425*a*: source electrode layer, 425*b*: drain electrode layer, 426: oxide insulating layer, 427: insulating layer, 428: protective insulating layer, 429: connection electrode layer, 430: capacitor wiring layer, 431: capacitor electrode layer, 440: thin film transistor, 441: oxide semiconductor layer, 442: connection electrode layer, 443: channel formation region, 444*a*: high-resistance source region, 444*b*: high-resistance drain region, 444*c*: first region, 444*d*: second region, 445*a*: source electrode layer, 445*b*: drain electrode layer, 446*a*: oxide conductive layer, 446*b*: oxide conductive layer, 447: oxide conductive layer, 448: oxide conductive layer, 449: connection electrode layer, 450: thin film transistor, 451*a*: gate electrode layer, 451*b*: gate electrode layer, 452: connection electrode layer, 453: oxide semiconductor layer, 454: oxide semiconductor layer, 455*a*: source electrode layer, 455*b*: drain electrode layer, 456: color filter layer, 457: first electrode, 458: overcoat layer, 459: partition, 460: thin film transistor, 1001: electrode, 1002: EL layer, 1003: charge generation layer, 1100: mobile phone, 1101: housing, 1102: display portion, 1103: operation button, 1104: external connection port, 1105: speaker, 1106: microphone, 1800: housing, 1801: housing, 1802: display panel, 1803: speaker, 1804: microphone, 1805: operation key, 1806: pointing device, 1807: camera lens, 1808: external connection terminal, 1810: keyboard, 1811: external memory slot, 3000: desk lamp, 3001: lighting device, 4501: substrate, 4502: pixel portion, 4503*a*: signal line driver circuit, 4503*b*: signal line driver circuit, 4504*a*: scan line driver circuit, 4504*b*: scan line driver circuit, 4505: sealant, 4506: substrate, 4507: filler, 4509: thin film transistor, 4510: thin film transistor, 4511: light-emitting element, 4512: EL layer, 4513: electrode, 4515: connection terminal electrode, 4516: terminal electrode, 4517: electrode, 4518*a*: FPC, 4518*b*: FPC, 4519: anisotropic conductive film, 4520: partition, 4540: conductive layer, 4541: oxide insulating layer, 4542: oxide insulating layer, 4543: overcoat layer, 4544: insulating layer, 4545: color filter layer, 4546: insulating layer, 4548: connection electrode layer, 5300: substrate, 5301: pixel portion, 5302: first scan line driver circuit, 5303: second scan line driver circuit, 5304: signal line driver circuit, 5305: timing control circuit, 5601: shift register, 5602: switching circuit portion, 5603: thin film transistor, 5604: wiring, 5605: wiring, 6400: pixel, 6401: switching transistor, 6402: driver transistor, 6403: capacitor, 6404: light-emitting element, 6405: signal line, 6406: scan line, 6407: power supply line, 6408: common electrode, 7001: TFT, 7002: light-emitting element, 7003: electrode, 7004: EL layer, 7005: electrode, 7009: partition, 7011: TFT, 7012: light-emitting element, 7013: electrode, 7014: EL layer, 7015: electrode, 7016: light-blocking film, 7017: conductive film, 7019: partition, 7021: TFT, 7022: light-emitting element, 7023: electrode, 7024: EL layer, 7025: electrode, 7027: conductive film, 7029: partition, 7030: connection electrode layer, 7031: oxide insulating layer, 7032: insulating layer, 7033: color filter layer, 7034: overcoat layer, 7035: protective insulating layer, 7040: connection electrode layer, 7041: oxide insulating layer, 7042: insulating layer, 7043: color filter layer, 7044: overcoat layer, 7045: protective insulating layer, 7050: connection electrode layer, 7051: oxide insulating layer, 7052: protective insulating layer, 7053: planarizing insulating layer, 7055: insulating layer, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: recording medium insertion portion, 9887: connection terminal, 9888: sensor, 9889: microphone, 9890: LED lamp, 9891: housing, 9893: connection portion.

The invention claimed is:

1. A light-emitting device comprising:
a pixel portion comprising:
   a first transistor comprising:
      a first gate electrode layer; and
      a first oxide semiconductor layer over the first gate electrode layer with a gate insulating layer between the first gate electrode layer and the first oxide semiconductor layer, the first oxide semiconductor layer comprising a first channel formation region; and
a driver circuit comprising:
   a second transistor comprising:
      a second gate electrode layer; and
      a second oxide semiconductor layer over the second gate electrode layer with the gate insulating layer between the second gate electrode layer and the second oxide semiconductor layer, the second oxide semiconductor layer comprising a second channel formation region,
wherein an oxide insulating layer is over the first oxide semiconductor layer and the second oxide semiconductor layer,
wherein the oxide insulating layer is in contact with the first channel formation region, and
wherein the oxide insulating layer comprises an opening overlapping the second channel formation region.

2. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer,
wherein a conductive material of the second gate electrode layer has a lower resistance than a conductive material of the first gate electrode layer,
wherein a conductive material of the second source electrode layer has a lower resistance than a conductive material of the first source electrode layer, and
wherein a conductive material of the second drain electrode layer has a lower resistance than a conductive material of the first drain electrode layer.

3. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer,
wherein the pixel portion further comprises a connection electrode layer over the first drain electrode layer with the oxide insulating layer between the connection electrode layer and the first drain electrode layer,
wherein the connection electrode layer is electrically connected to the first drain electrode layer, and
wherein the connection electrode layer is formed using a film containing an element selected from the group consisting of Al, Cr, Cu, Ta, Ti, Mo, and W as its main component, or a stacked-layer film including the film containing the element as its main component and an alloy film containing the element.

4. The light-emitting device according to claim 3, wherein each of the second source electrode layer and the second drain electrode layer contains a same material as the connection electrode layer.

5. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer, and
wherein each of the first source electrode layer and the first drain electrode layer contains an indium oxide, an alloy of an indium oxide and a tin oxide, an alloy of an indium oxide and a zinc oxide, or a zinc oxide.

6. The light-emitting device according to claim 1, wherein the oxide insulating layer is a silicon oxide film or an aluminum oxide film formed by a sputtering method.

7. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer,
wherein a first oxide conductive layer is formed between the second oxide semiconductor layer and the second source electrode layer, and
wherein a second oxide conductive layer is formed between the second oxide semiconductor layer and the second drain electrode layer.

8. The light-emitting device according to claim 1, wherein each of the first oxide semiconductor layer and the second oxide semiconductor layer comprises In, Ga, Zn and O.

9. An electronic apparatus comprising the light-emitting device according to claim 1, wherein the electronic apparatus is selected from the group consisting of a television set, a camera, a digital photo frame, a mobile phone set, a portable game console, a portable information terminal and an audio reproducing device.

10. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer, and
wherein an insulating layer over the second source electrode layer, the second drain electrode layer and the second oxide semiconductor layer is in direct contact with the second channel formation region between the second source electrode layer and the second drain electrode layer.

11. The light-emitting device according to claim 1,
wherein the first oxide semiconductor layer is in contact with a first source electrode layer and a first drain electrode layer,
wherein the second oxide semiconductor layer is in contact with a second source electrode layer and a second drain electrode layer,
wherein the pixel portion further comprises:
a connection electrode layer over the first drain electrode layer with the oxide insulating layer between the connection electrode layer and the first drain electrode layer;
a color filter layer over the oxide insulating layer;
a first electrode over the color filter layer, the first electrode being electrically connected to the connection electrode layer;
a light-emitting layer over the first electrode; and
a second electrode over the light-emitting layer,
wherein the connection electrode layer is electrically connected to the first drain electrode layer,
wherein the pixel portion and the driver circuit are formed over a same substrate, and
wherein each of the first gate electrode layer, the gate insulating layer, the first oxide semiconductor layer, the first source electrode layer, the first drain electrode layer, the oxide insulating layer and the first electrode has light-transmitting properties.

12. A light-emitting device comprising:
a first gate electrode layer over a substrate;
a second gate electrode layer over the substrate;
a gate insulating layer over the first gate electrode layer and the second gate electrode layer;
a first source electrode layer over the gate insulating layer;
a first drain electrode layer over the gate insulating layer;
a first oxide semiconductor layer comprising a first channel formation region over the first source electrode layer, the first drain electrode layer and the gate insulating layer, the first oxide semiconductor layer overlapping with the first gate electrode layer, wherein the first oxide semiconductor layer is electrically connected to the first source electrode layer and the first drain electrode layer;
a second oxide semiconductor layer comprising a second channel formation region over the gate insulating layer, the second oxide semiconductor layer overlapping with the second gate electrode layer;
an oxide insulating layer over the gate insulating layer, the first source electrode layer, the first drain electrode layer, the first oxide semiconductor layer and the second oxide semiconductor layer, the oxide insulating layer having an opening overlapping with the second channel formation region;
a second source electrode layer over the oxide insulating layer and the second oxide semiconductor layer, the second source electrode layer being electrically connected to the second oxide semiconductor layer;
a second drain electrode layer over the oxide insulating layer and the second oxide semiconductor layer, the second drain electrode layer being electrically connected to the second oxide semiconductor layer;
a connection electrode layer over the oxide insulating layer, the connection electrode layer being electrically connected to the first drain electrode layer;
an insulating layer over the second oxide semiconductor layer, the oxide insulating layer, the second source electrode layer and the second drain electrode layer, the insulating layer being in direct contact with the second channel formation region;
a color filter layer over the insulating layer;
a first electrode over the color filter layer, the first electrode being electrically connected to the connection electrode layer;
a light-emitting layer over the first electrode; and
a second electrode over the light-emitting layer, wherein each of the first gate electrode layer, the gate insulating layer, the first oxide semiconductor layer, the first source electrode layer, the first drain electrode layer, the oxide insulating layer, the insulating layer and the first electrode has light-transmitting properties.

13. The light-emitting device according to claim 12,
wherein a conductive material of the second gate electrode layer has a lower resistance than a conductive material of the first gate electrode layer,
wherein a conductive material of the second source electrode layer has a lower resistance than a conductive material of the first source electrode layer, and
wherein a conductive material of the second drain electrode layer has a lower resistance than a conductive material of the first drain electrode layer.

14. The light-emitting device according to claim 12, wherein the connection electrode layer is formed using a film containing an element selected from the group consisting of Al, Cr, Cu, Ta, Ti, Mo, and W as its main component, or a stacked-layer film including the film containing the element as its main component and an alloy film containing the element.

15. The light-emitting device according to claim 12, wherein each of the second source electrode layer and the second drain electrode layer contains a same material as the connection electrode layer.

16. The light-emitting device according to claim 12, wherein each of the first source electrode layer and the first drain electrode layer contains an indium oxide, an alloy of an indium oxide and a tin oxide, an alloy of an indium oxide and a zinc oxide, or a zinc oxide.

17. The light-emitting device according to claim 12, wherein the oxide insulating layer is a silicon oxide film or an aluminum oxide film formed by a sputtering method.

18. The light-emitting device according to claim 12,
wherein a first oxide conductive layer is formed between the second oxide semiconductor layer and the second source electrode layer, and
wherein a second oxide conductive layer is formed between the second oxide semiconductor layer and the second drain electrode layer.

19. The light-emitting device according to claim 12, wherein each of the first oxide semiconductor layer and the second oxide semiconductor layer comprises In, Ga, Zn and O.

20. An electronic apparatus comprising the light-emitting device according to claim 12, wherein the electronic apparatus is selected from the group consisting of a television set, a camera, a digital photo frame, a mobile phone set, a portable game console, a portable information terminal and an audio reproducing device.

* * * * *